(12) United States Patent
Dornel

(10) Patent No.: US 9,659,781 B2
(45) Date of Patent: May 23, 2017

(54) METHOD FOR FORMING A FLOATING GATE IN A RECESS OF A SHALLOW TRENCH ISOLATION (STI) REGION

(71) Applicant: International Business Machines Corporation, Armonk, NY (US)

(72) Inventor: Erwan Dornel, Fontaine (FR)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/525,424

(22) Filed: Oct. 28, 2014

(65) Prior Publication Data

US 2015/0041878 A1 Feb. 12, 2015

Related U.S. Application Data

(62) Division of application No. 13/456,471, filed on Apr. 26, 2012.

(51) Int. Cl.

| | |
|---|---|
| *H01L 21/763* | (2006.01) |
| *H01L 27/115* | (2006.01) |
| *H01L 29/788* | (2006.01) |
| *H01L 21/28* | (2006.01) |
| *H01L 29/423* | (2006.01) |
| *H01L 27/11517* | (2017.01) |
| *H01L 29/66* | (2006.01) |
| *H01L 21/762* | (2006.01) |

(52) U.S. Cl.
CPC .. *H01L 21/28273* (2013.01); *H01L 21/76232* (2013.01); *H01L 27/11517* (2013.01); *H01L 29/42324* (2013.01); *H01L 29/42336* (2013.01); *H01L 29/66825* (2013.01); *H01L 29/788* (2013.01); *H01L 29/7881* (2013.01)

(58) Field of Classification Search
CPC ........ H01L 21/76232; H01L 27/11517; H01L 29/42324; H01L 29/42336; H01L 29/66825; H01L 29/788
See application file for complete search history.

(56) References Cited

U.S. PATENT DOCUMENTS

| | | | |
|---|---|---|---|
| 5,045,490 A | * | 9/1991 | Esquivel ............... H01L 27/115 257/E27.103 |
| 5,117,276 A | | 5/1992 | Thomas et al. |
| 6,074,927 A | | 6/2000 | Kepler et al. |

(Continued)

OTHER PUBLICATIONS

Claim recitation for U.S. Appl. No. 13/456,471, filed Mar. 24, 2015.*

(Continued)

*Primary Examiner* — Eduardo A Rodela
*Assistant Examiner* — Christopher M Roland
(74) *Attorney, Agent, or Firm* — Cantor Colburn LLP; Steven Meyers

(57) ABSTRACT

A method includes forming a shallow trench isolation (STI) region in a substrate, the STI region comprising an etch stop layer; etching the STI region by a first etch to the etch stop layer to form a recess in the STI region; and forming a floating gate, the floating gate comprising a portion that extends into the recess in the STI region, wherein the etch stop layer separates the portion of the floating gate that extends into the recess in the STI region from the substrate.

4 Claims, 26 Drawing Sheets

(56) References Cited

U.S. PATENT DOCUMENTS

| | | | |
|---|---|---|---|
| 6,159,801 | A | 12/2000 | Hsieh et al. |
| 6,452,246 | B1 * | 9/2002 | Komori .......................... 257/506 |
| 6,589,840 | B2 | 7/2003 | Tseng |
| 7,045,852 | B2 | 5/2006 | Van Duuren et al. |
| 7,371,629 | B2 | 5/2008 | Fu et al. |
| 7,767,546 | B1 | 8/2010 | Dennard et al. |
| 2003/0068898 | A1 | 4/2003 | Lee et al. |
| 2009/0026525 | A1 | 1/2009 | Wang et al. |
| 2011/0031549 | A1 | 2/2011 | Kondo et al. |
| 2011/0053365 | A1 | 3/2011 | Hwang et al. |
| 2011/0057241 | A1 | 3/2011 | Irani et al. |
| 2012/0098088 | A1 | 4/2012 | Chen et al. |

OTHER PUBLICATIONS

A. Bergemont, et al., "Current Limitaitons of Floating Gate NVM and New Alternatives," EDS Meeting; Apr. 10, 2007; Maxim Integrated Products; p. 19; pp. 1-55.

R. Duane, et al., "Novel Capacitance Coupling Coefficient Measurement Methodology for Floating Gate Nonvolatile Memory Devices," Electron Device Letter, IEEE, Jul. 2005, on pp. 507-509.

\* cited by examiner

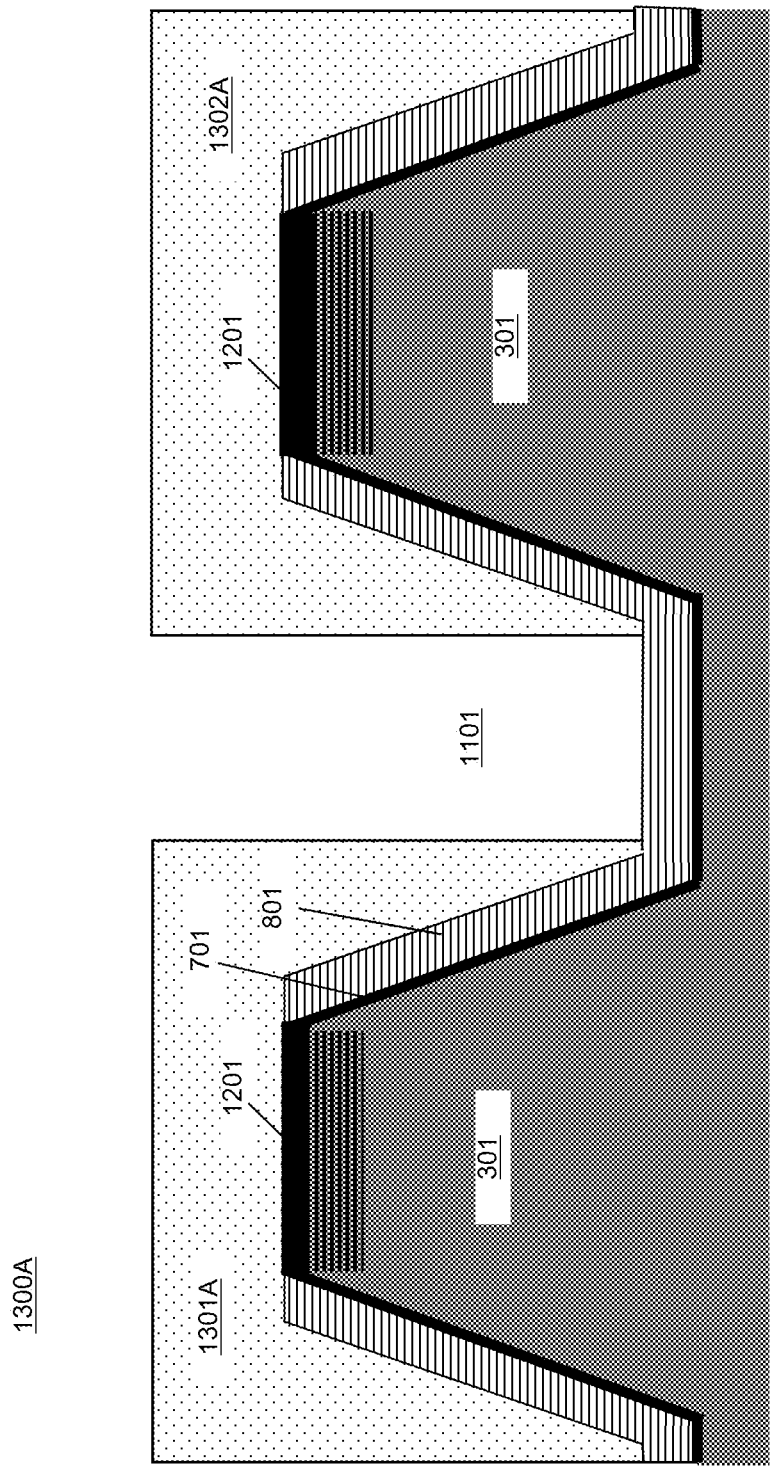

METHOD FOR FORMING A FLOATING GATE IN A RECESS OF A SHALLOW TRENCH ISOLATION (STI) REGION

DOMESTIC PRIORITY

This application is a divisional of U.S. application Ser. No. 13/456,471 (Dornel), filed on Apr. 26, 2012, which is herein incorporated by reference in its entirety.

BACKGROUND

This disclosure relates generally to the field of computer memory, and more particular to a non-volatile memory (NVM) device formed with an etch stop layer in the shallow trench isolation (STI) regions.

NVM devices are used in various types of computer memory, for example, flash devices. An NVM device includes a floating gate separated from a control gate by a gate dielectric layer. A major concern in NVM devices is the gate coupling factor. A high gate coupling factor results in good control of the floating gate by the control gate during device operation and increases NVM device performance. The gate coupling factor of a NVM device is dependent on both the capacitance between the control gate and the floating gate, and the capacitance between the floating gate and the substrate. For an increase of 1 volt (V) of the control gate potential, the floating gate potential increases by a factor $\alpha_{CG}$, which is a factor related to the coupling factor between the floating gate and the control gate. $\alpha_{CG}$ needs to be relatively low to ensure good control of the floating gate by the control gate during device operation. However, capacitance that exists between the floating gate and the device substrate may act to raise $\alpha_{CG}$. Therefore, in order to raise the gate coupling factor of a NVM device, the capacitance between the control gate and the floating gate needs to be raised and/or the capacitance between the substrate and the floating gate needs to be lowered.

One way to increase the capacitance between the floating gate and the control gate is to decrease the equivalent oxide thickness (EOT) of the gate dielectric located between the floating gate and control gate. However, if the gate dielectric is made too thin, a tunneling current between the floating gate and control gate may arise, leading to the loss of data that is stored in the NVM device. Various floating gate shapes that are used in NVM devices to increase the capacitance between the floating gate and the control gate may also have the effect of increasing the capacitance between the floating gate and the substrate, which results in a relatively low net increase in the gate coupling factor of the device, and hence low increase in NVM device performance.

SUMMARY

In one aspect, a method includes forming a shallow trench isolation (STI) region in a substrate, the STI region comprising an etch stop layer; etching the STI region by a first etch to the etch stop layer to form a recess in the STI region; and forming a floating gate, the floating gate comprising a portion that extends into the recess in the STI region, wherein the etch stop layer separates the portion of the floating gate that extends into the recess in the STI region from the substrate.

In another aspect, a device includes a substrate; a shallow trench isolation (STI) region located in the substrate, the STI region comprising an etch stop layer, and further comprising a recess in the STI region, the recess having a bottom and sides, wherein the sides of the recess are defined by the etch stop layer; and a floating gate, wherein a portion of the floating gate is located on a side of the recess in the STI region and is separated from the substrate by the etch stop layer.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES:

FIGS. 13A-B are cross sectional views illustrating embodiments of a device after formation of floating gates.

DETAILED DESCRIPTION

Embodiments of a NVM device formed with an etch stop layer in a shallow trench isolation (STI) region, and a method of forming a NVM device with an etch stop layer in a STI region are provided, with exemplary embodiments being discussed below in detail. Inclusion of an etch stop layer in the STI region allows controlled etching of a recess in the STI region. The floating gate and the control gate of the NVM device are then formed such that they extend into the recess in the STI region, inducing a relatively high capacitance between the floating gate and the control gate. The floating gate may be separated from the substrate by the etch stop layer, so that the distance between the floating gate and substrate may be relatively high, resulting in a relatively low capacitance between the substrate and the floating gate. The overall coupling factor of the device may be thereby increased. The etch stop layer may be located on the both the sides and bottom of the STI trench in some embodiments, or may only be located on the sides of the STI trench in other embodiments. Inclusion of etch stop layers in the STI regions between NVM devices may also reduce variability in the gate coupling factor across a plurality of NVM devices.

Figure 1:
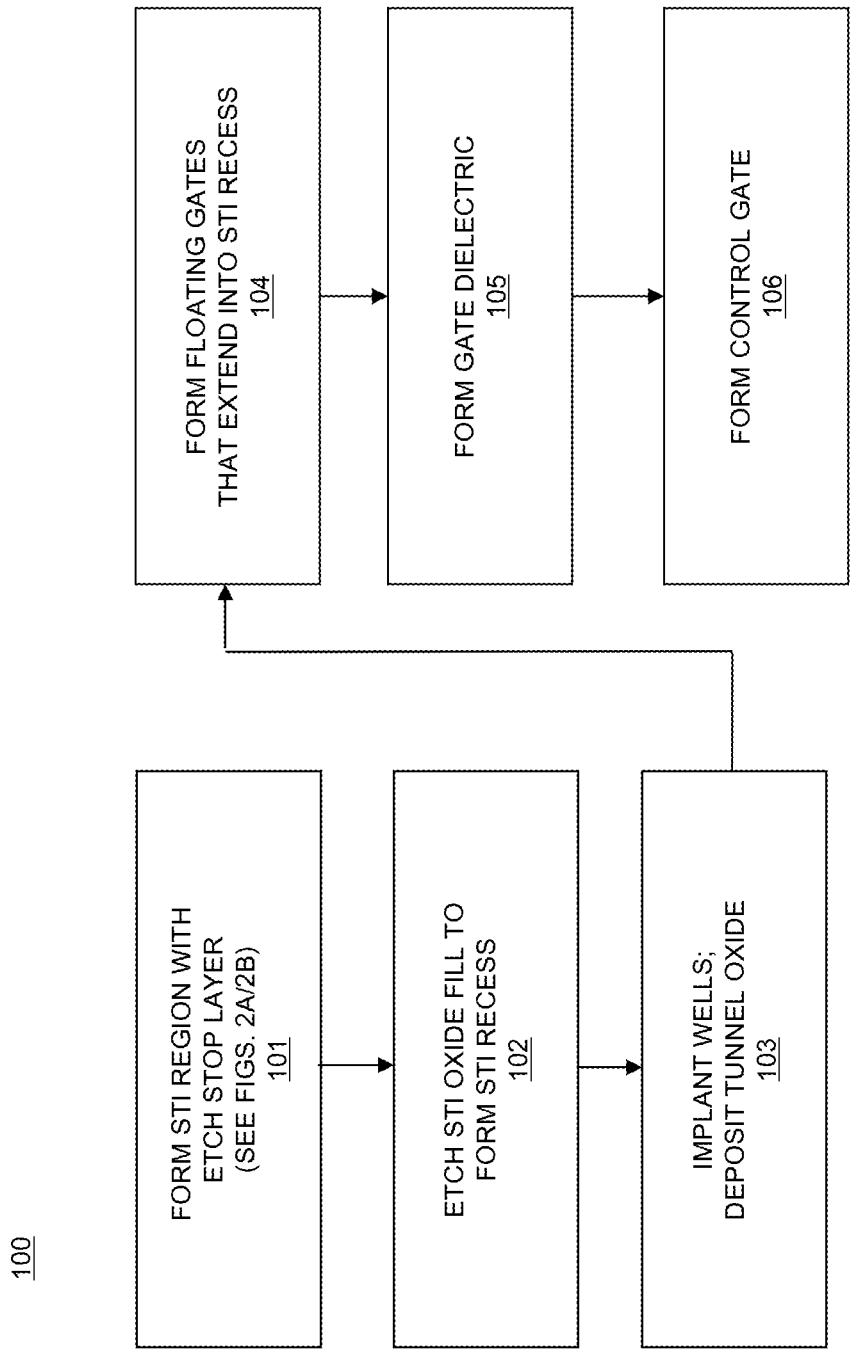
FIG. 1 illustrates a flowchart of an embodiment of a method of forming a NVM device formed with an etch stop layer in a STI region.

FIG. 1 shows a flowchart of a method 100 of forming a NVM device with an etch stop layer in a shallow trench isolation (STI) region. Two embodiments of the process flow of FIG. 1 are discussed in detail. In the first embodiment, the etch stop layer in the STI region may be formed such that the etch stop layer covers the sides and bottom of the STI trench; formation of a STI region including such an etch stop layer in the STI region is discussed with respect to method 200A of FIG. 2A, and the process flow of formation of a memory device according to the first embodiment is discussed with respect to FIGS. 3-15. In the second embodiment, the etch stop layer in the STI region may be formed such that the etch stop layer only covers the sides of the STI trench; formation of a STI region including such an etch stop layer in the STI region is discussed with respect to method 200B of FIG. 2B, and the process flow of formation of a memory device according to the first embodiment is discussed with respect to FIGS. 3-8 and 16-23.

Figure 2A:
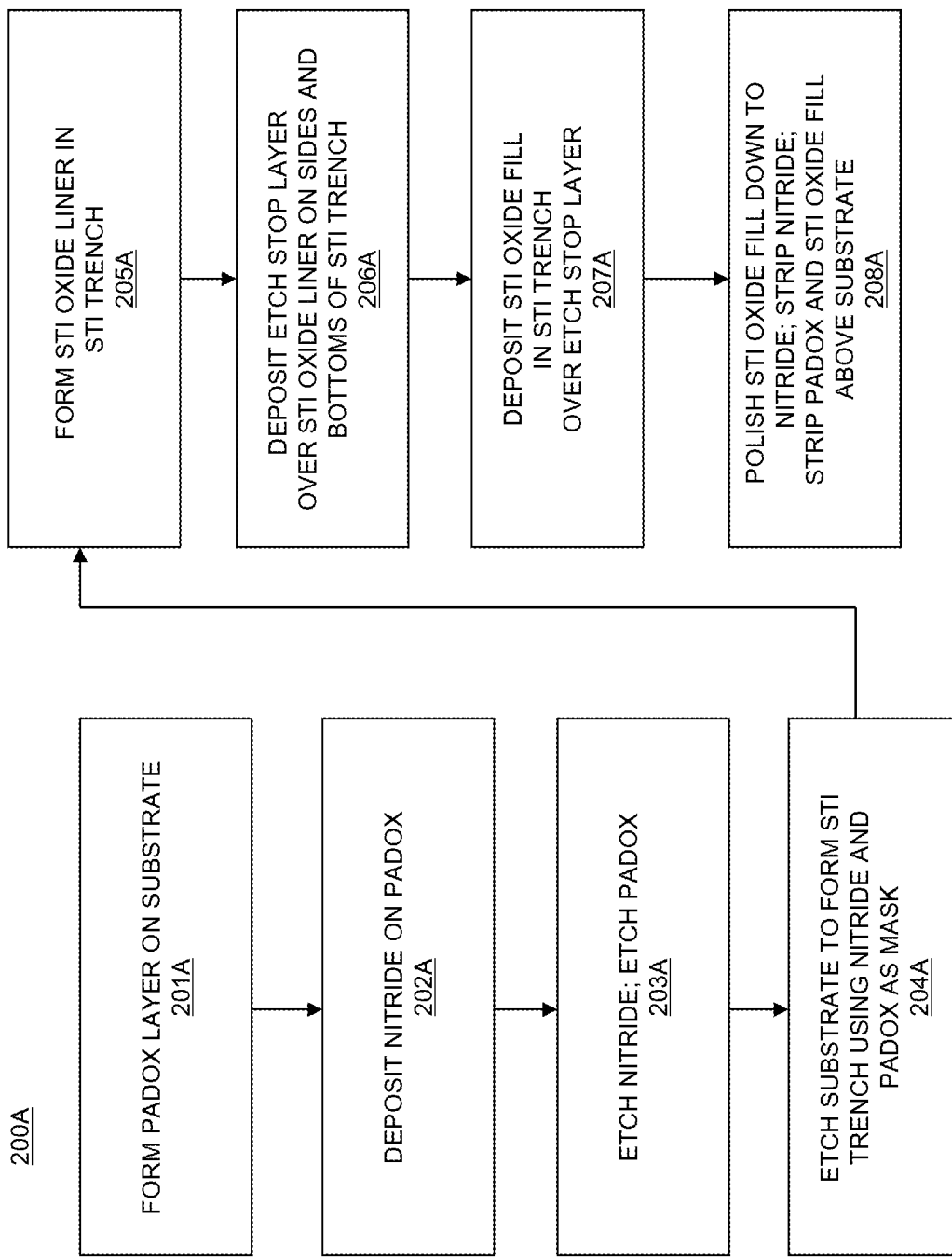
FIGS. 2A-B illustrate flowcharts of embodiments of methods of forming a shallow trench isolation (STI) region with an etch stop layer for a NVM device.
Figure 3:
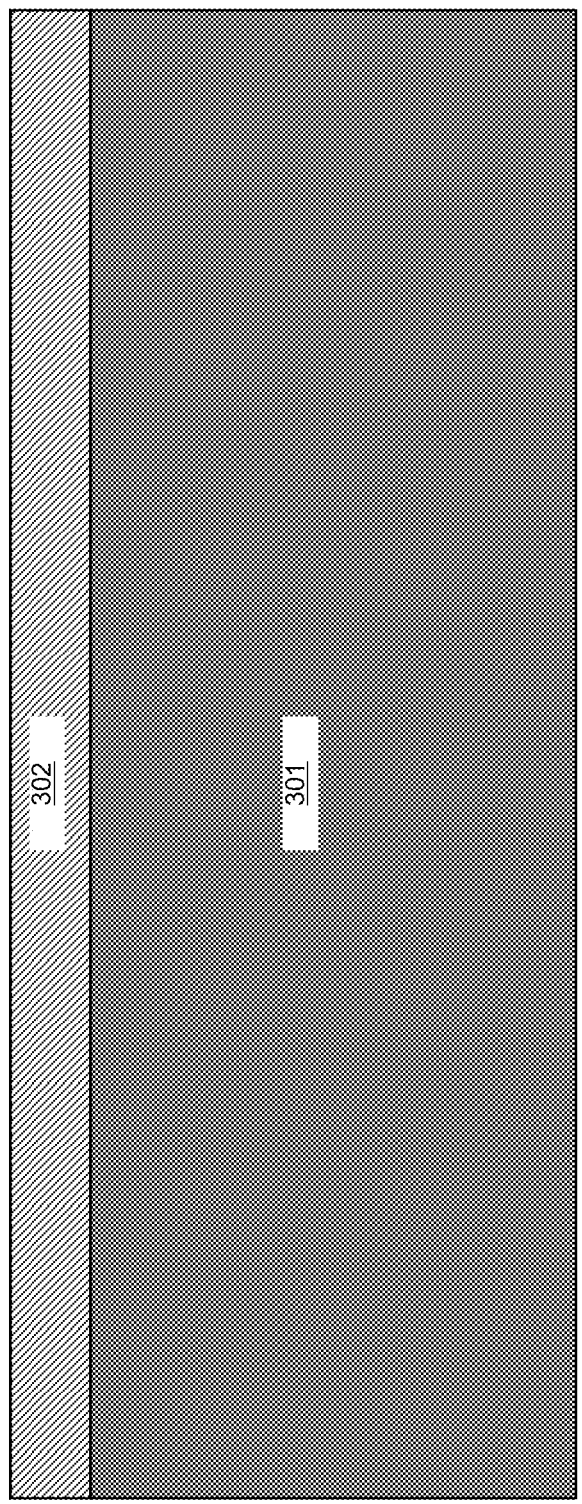
FIG. 3 is a cross sectional view illustrating an embodiment of a substrate after formation of a padox layer over the substrate.
Figure 4:
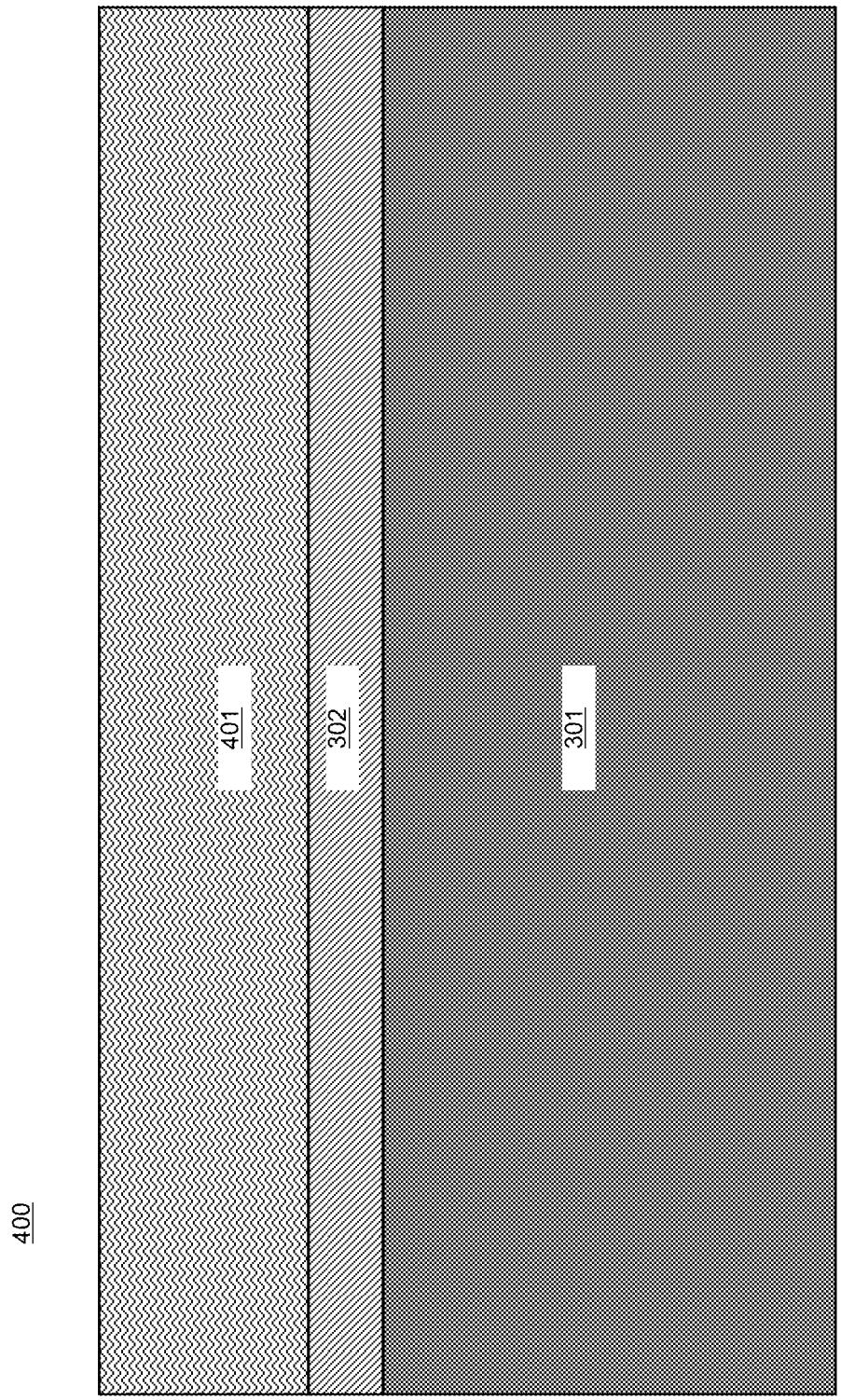
FIG. 4 is a cross sectional view illustrating an embodiment of a device after formation of a nitride layer over the oxide layer.

Turning to the first embodiment of the process flow of method 100 of FIG. 1, first, in block 101 of FIG. 1, STI regions comprising an etch stop layer may be formed in a wafer comprising a silicon substrate. A flowchart of a method 200A of formation of the STI regions according to the first embodiment is shown in FIG. 2A. Referring to FIG. 2A, in block 201A, first, a padox layer, which comprises a uniform, relatively thin layer of oxide, may be formed on a top surface of a silicon substrate. FIG. 3 shows an embodiment of a device 300 including a silicon substrate 301 after formation of a padox layer 302 on the top surface of the silicon substrate. Then, returning to FIG. 2A, flow proceeds to block 202A, in which a nitride layer may be formed over the padox layer. FIG. 4 shows the device 300 of FIG. 3 after formation of a nitride 401 over the padox layer 302.

Figure 5:
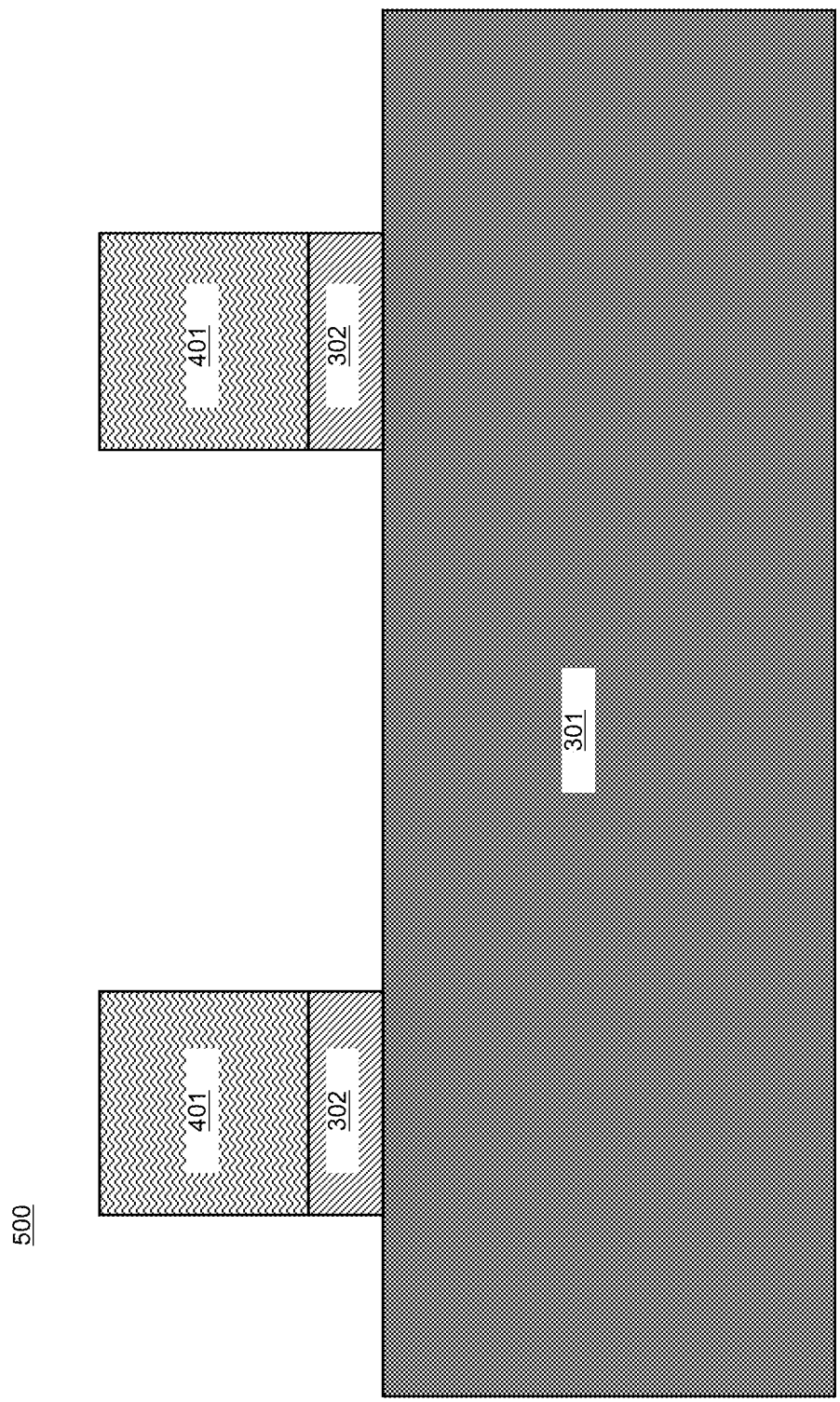
FIG. 5 is a cross sectional view illustrating an embodiment of a device after patterning the nitride layer and the oxide layer.
Figure 6:
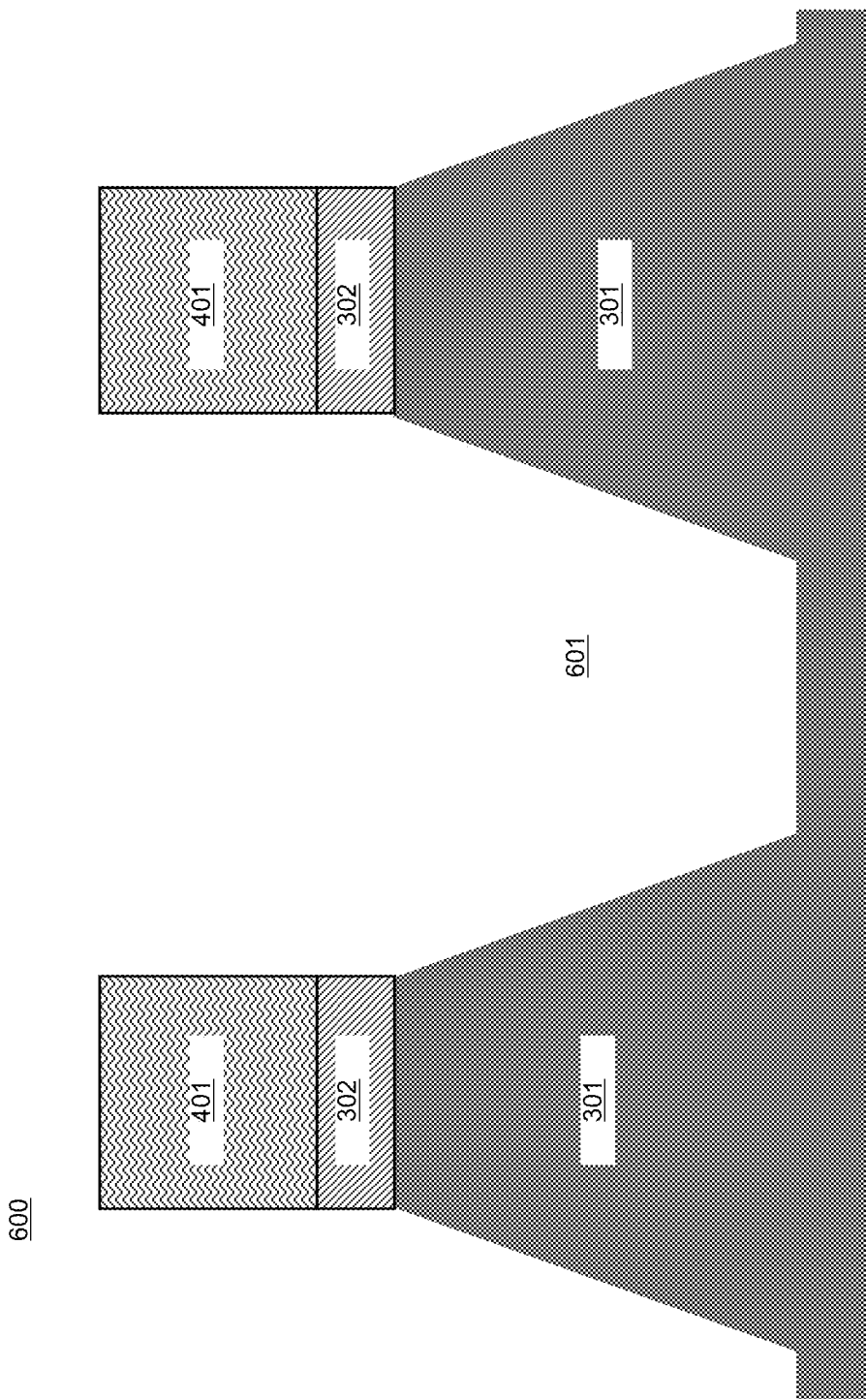
FIG. 6 is a cross sectional view illustrating an embodiment of a device after formation of a STI trench.
Figure 7:
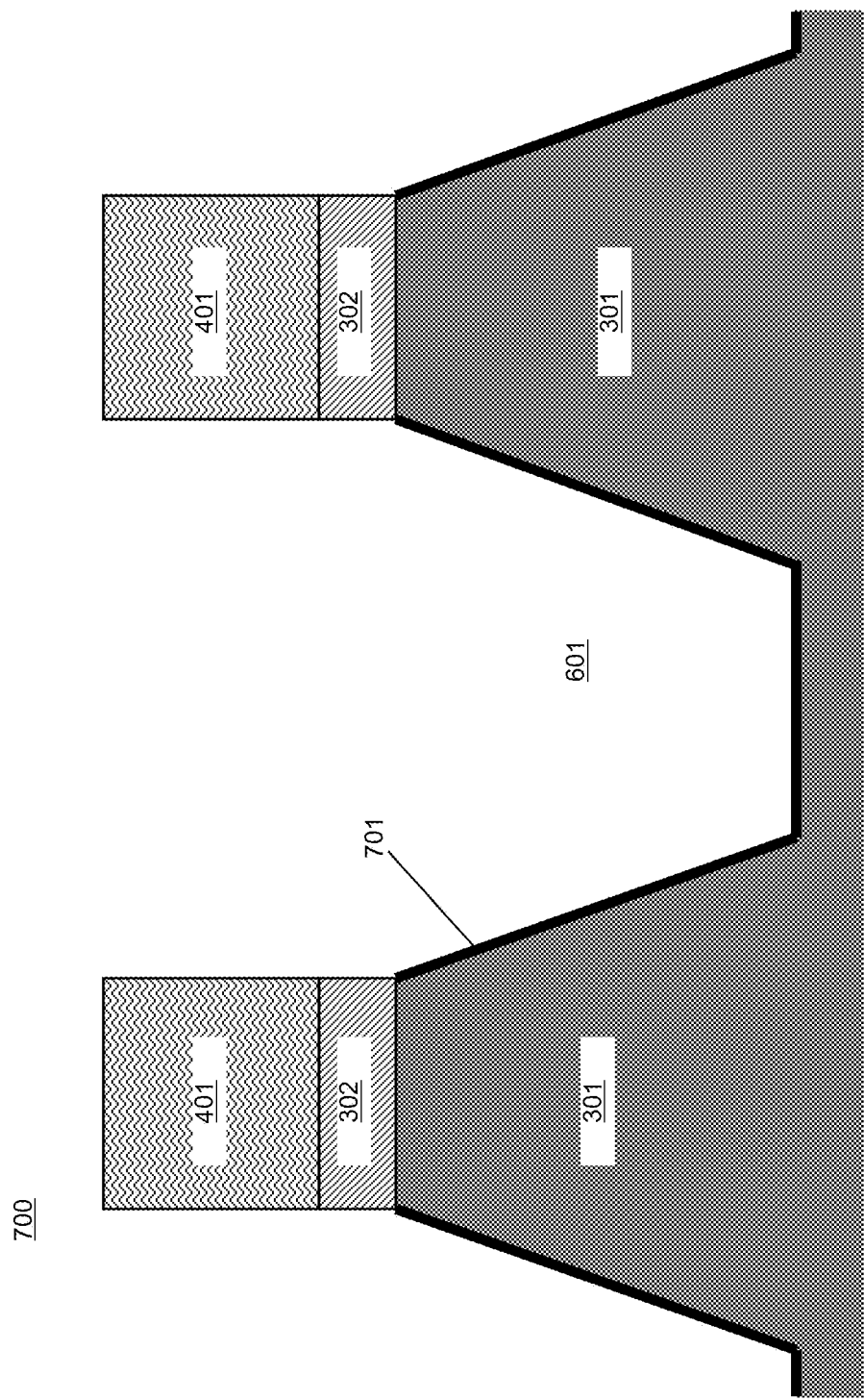
FIG. 7 is a cross sectional view illustrating an embodiment of a device after formation of a STI liner in the STI trench.

Next, returning to method 200A of FIG. 2A, in block 203A the nitride and the padox are etched to form a mask for etching of an STI trench. The padox acts as an etch stop for the nitride during patterning of the nitride; the padox may then be subsequently patterned. FIG. 5 shows the device 400 of FIG. 4 after etching the nitride 401 and the padox layer 302. Then, proceeding to block 204A of method 200A of FIG. 2A, the STI trench may be etched in the silicon substrate. FIG. 6 shows the device 500 of FIG. 5 after etching of an STI trench 601 in the silicon substrate 301. After etching of the STI trench, flow of method 200A of FIG. 2A proceeds to block 205A, in which an STI liner may be formed in the STI trenches. The STI liner may comprise oxide, and may be formed by any appropriate method. FIG. 7 shows the device 600 of FIG. 6 after formation of an STI liner 701 on the bottom and sides of the STI trench 601.

Figure 8:
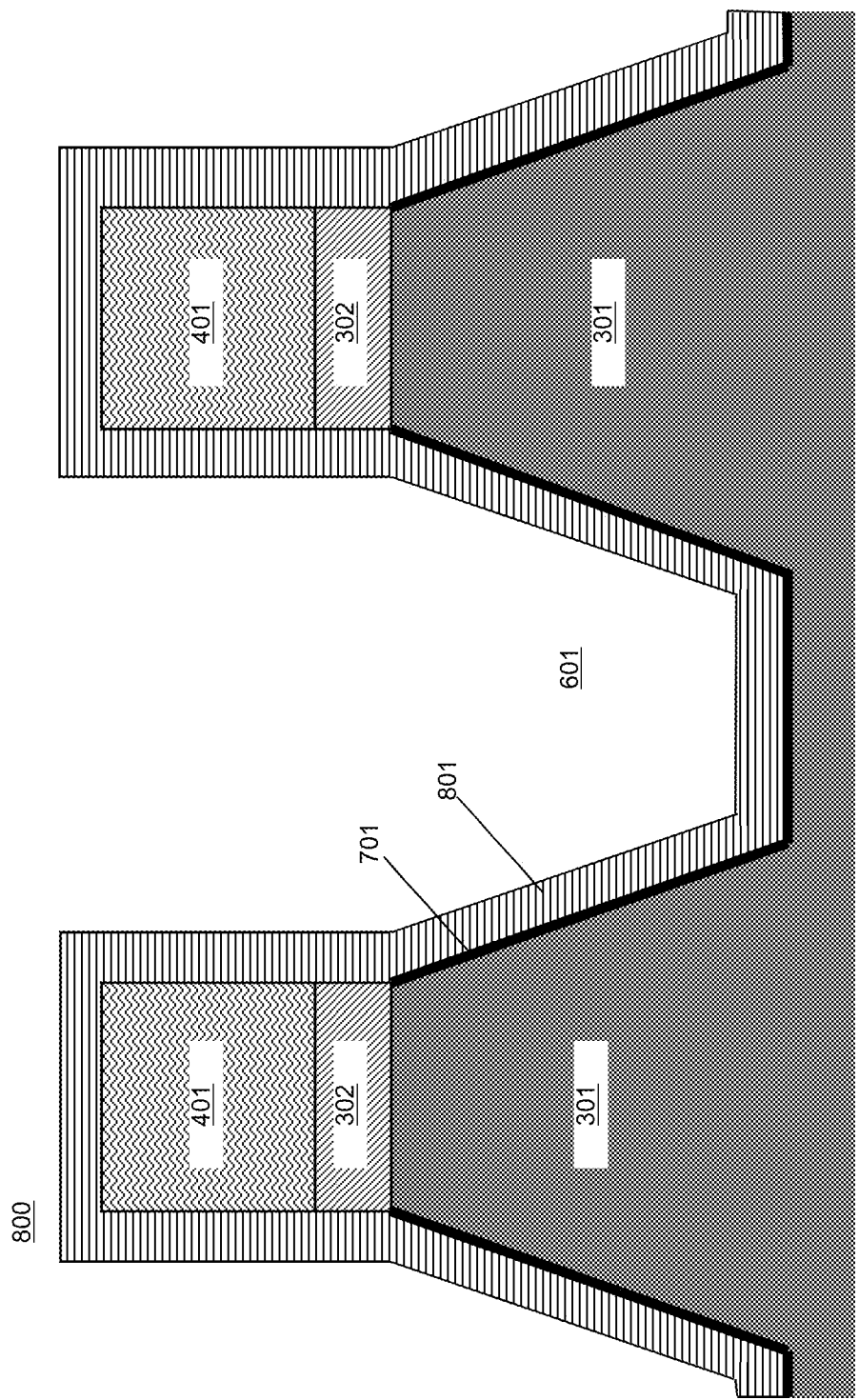
FIG. 8 is a cross sectional view illustrating an embodiment of a device after formation of an etch stop layer over the STI liner.
Figure 9:
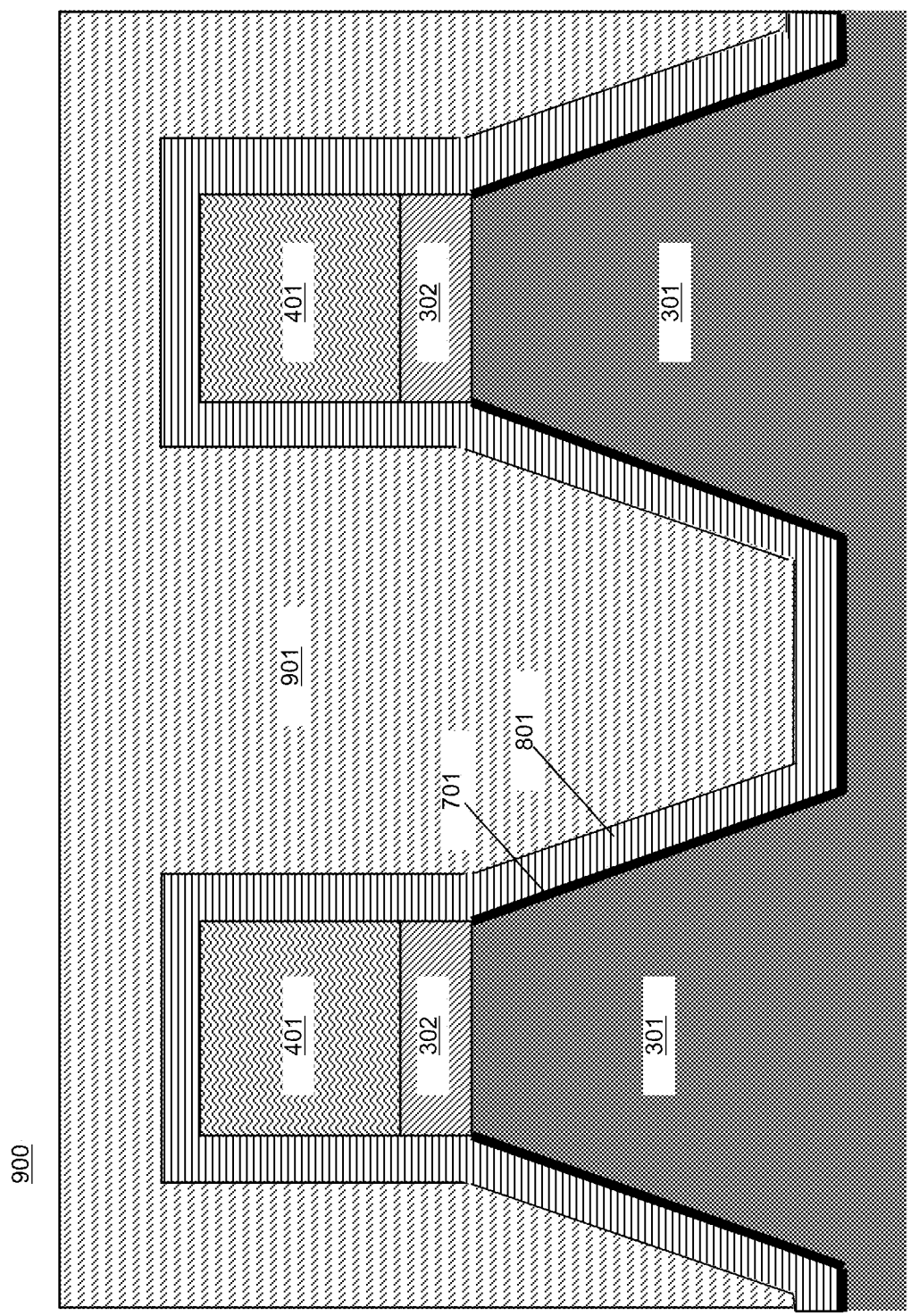
FIG. 9 is a cross sectional view illustrating an embodiment of a device after formation of a STI oxide fill.
Figure 10:
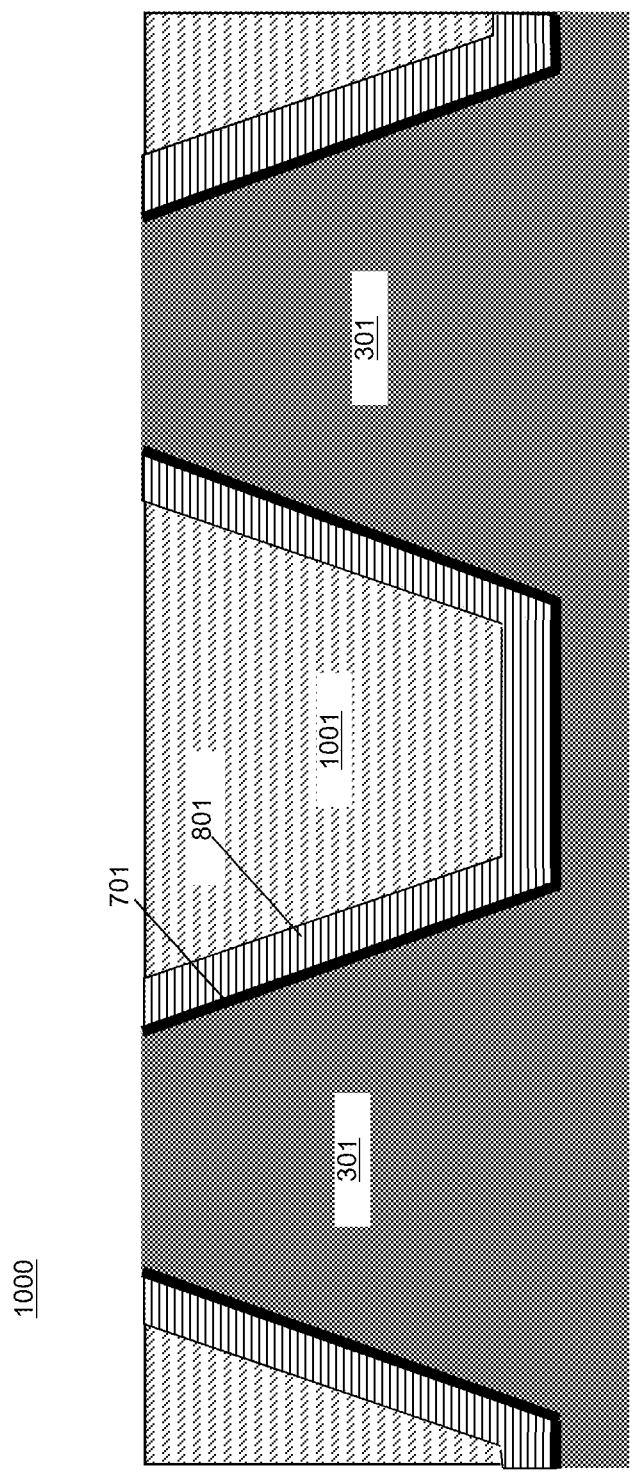
FIG. 10 is a cross sectional view illustrating an embodiment of a device after chemical mechanical polishing of the STI oxide fill and removal of the patterned padox and nitride.

Flow of method 200A of FIG. 2A then proceeds to block 206A, in which the etch stop layer may be deposited over the STI liner in the STI trench. The etch stop layer may comprise nitride. FIG. 8 shows an embodiment of the device 700 of FIG. 6 after deposition of the etch stop layer 801 over the STI liner 701. The etch stop layer covers the bottom and sides of the STI trench 601. The thickness of the etch stop layer determines the distance between the floating gate (discussed below with respect to block 104) and the substrate; therefore the deposition of the etch stop layer may be controlled to produce an etch stop layer having a desired thickness to improve the operation of the finished NVM device. Method 200A of FIG. 2A then proceeds to block 207A, in which an STI oxide fill may be deposited over the device, filling STI trench over the etch stop layer. FIG. 9 shows the device 800 of FIG. 8 after deposition of the oxide fill 901 over the device 800; the oxide fill 901 fills the STI trench 601 and covers the etch stop layer 801. Lastly, in block 208A of FIG. 2A, the top of the STI oxide fill may be polished down to expose the top surface of the etch stop layer, the excess etch stop and nitride on top of the substrate are removed by etching, the padox may be removed by etching so as to expose the top surface of the silicon substrate, and the top of oxide fill may be further removed to the level of the top surface of the silicon substrate. The excess oxide fill may be removed by chemical mechanical polishing (CMP) in some embodiments. FIG. 10 shows the device 900 of FIG. 9 after removal of the excess portion of oxide fill 901, the excess portion of the etch stop layer 801, nitride 401, and padox layer 302 to expose the top surface of silicon substrate 301. Device 1000 of FIG. 10 comprises a silicon substrate 301 with STI regions including STI liner 701, etch stop layer 801 over the STI liner 701, and STI oxide fill 1001.

Figure 11:
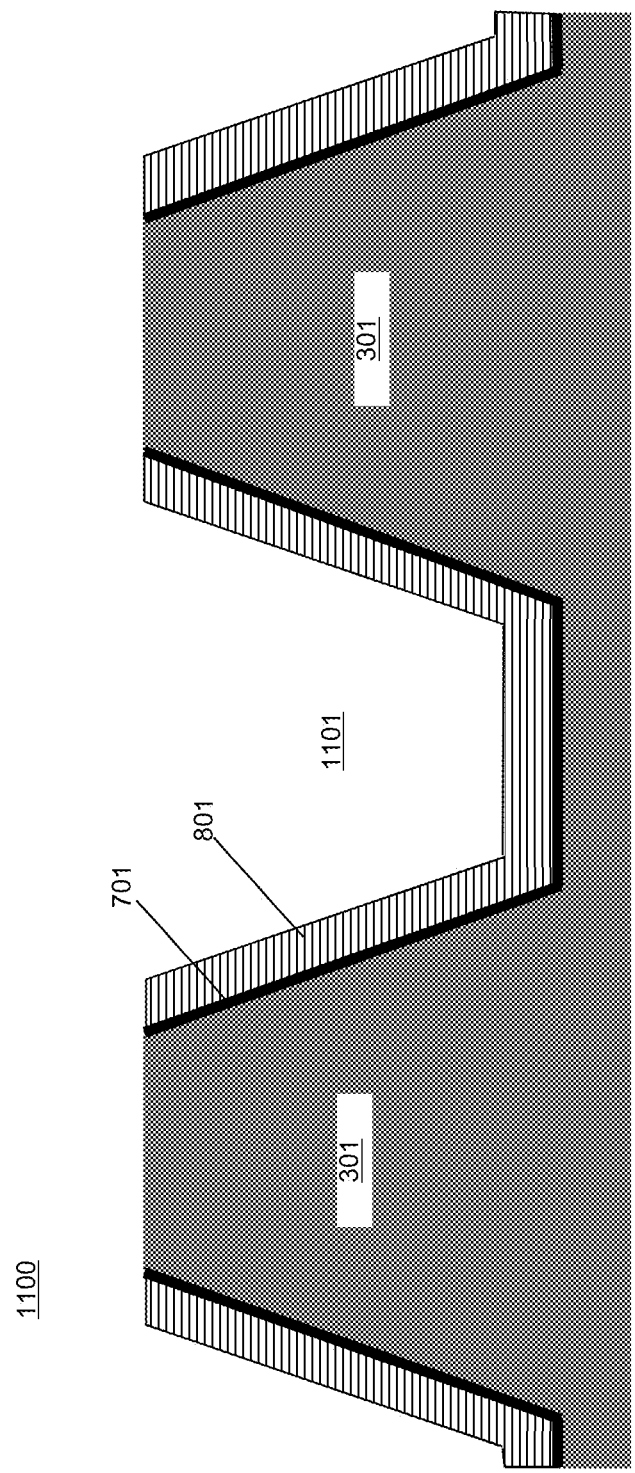
FIG. 11 is a cross sectional view illustrating an embodiment a device after etching the STI oxide fill down to the etch stop layer.

Returning to method 100 of FIG. 1, after formation of STI regions including an etch stop layer on the sides and bottom of the STI trench according to the method 200A outlined in FIG. 2A in block 101 of FIG. 1, flow proceeds to block 102, in which the oxide fill in the STI regions may be etched to form a recess. In the first embodiment of the process flow of FIG. 1, the oxide fill may be etched down to the etch stop layer on the sides and the bottom of the STI trench. The etch of the oxide fill may comprise a hydrofluoric (HF) etch in some embodiments. FIG. 11 shows the device 1000 of FIG. 10 after etching the oxide fill 1001 down to etch stop layer 801 to form recess 1101.

Figure 12:
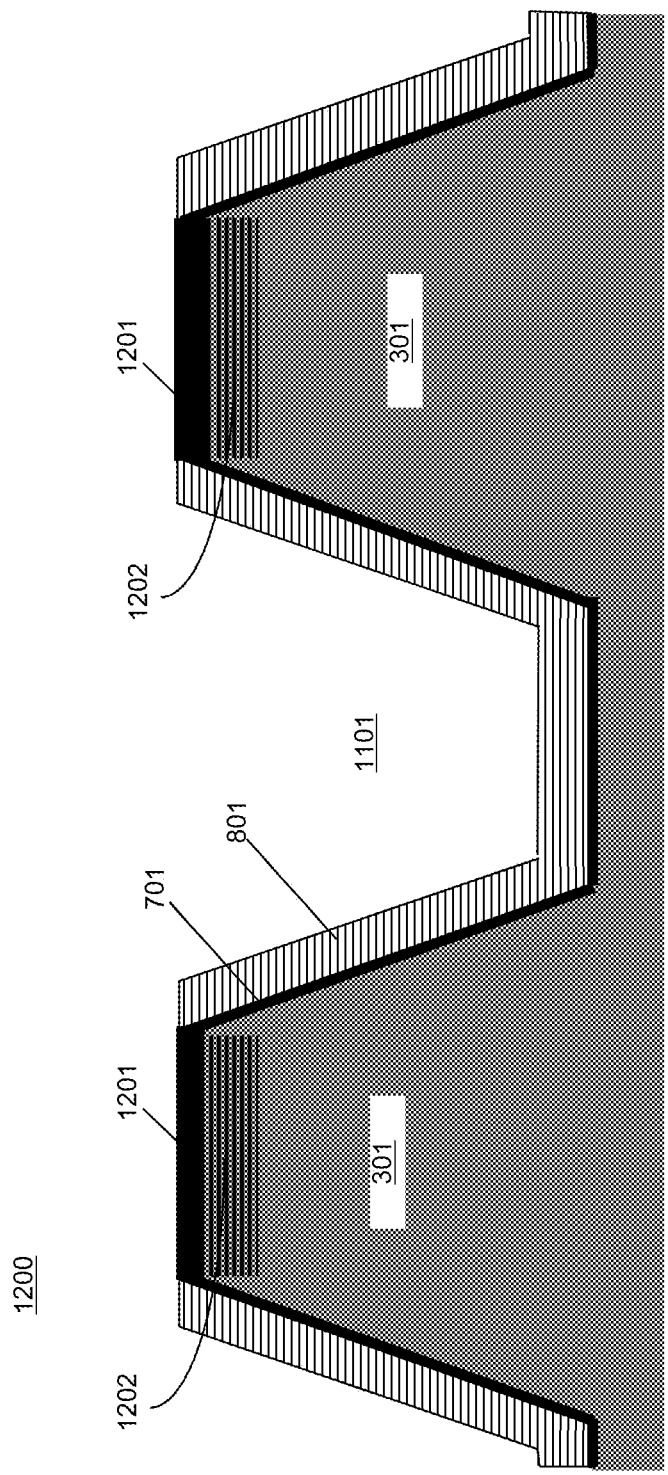
FIG. 12 is a cross sectional view illustrating an embodiment of a device after well implantation and tunnel oxide growth.

Flow of method 100 of FIG. 1 then proceeds to block 103, in which well implantation and tunnel oxide growth may be performed. The well implantation forms active regions in the silicon substrate near the top surface of the substrate. In some embodiments, the well implantation may be performed before etching of the STI oxide fill may be performed in block 102 of FIG. 1. After well implantation, tunnel oxide may be grown over the implanted well regions of the substrate. The well region implantation and the tunnel oxide growth may be performed by any appropriate method. For example, the tunnel oxide may be grown by chemical vapor deposition (CVD) or in-situ steam generation (ISSG) in various embodiments. The tunnel oxide may comprise a high k dielectric such as hafnium oxide ($HfO_2$), hafnium silicate ($HfSiO_2$) nitrided hafnium silicate (HfSiON), silicon oxinitride ($SiO_xN_y$), silicon nitride ($Si_3N_4$) or aluminum oxide ($Al_2O_3$) in some embodiments. In some embodiments, the order of blocks 102 and 103 in method 100 of FIG. 1 may be reversed, and the etch of the oxide fill that is performed in block 102 may be performed after the well implantation and tunnel oxide growth of block 103. FIG. 12 shows the device 1100 of FIG. 11 after implantation of well regions 1202 in the silicon substrate 301, and after growth of tunnel oxide 1201 over the well regions 1202.

Figure 13B:
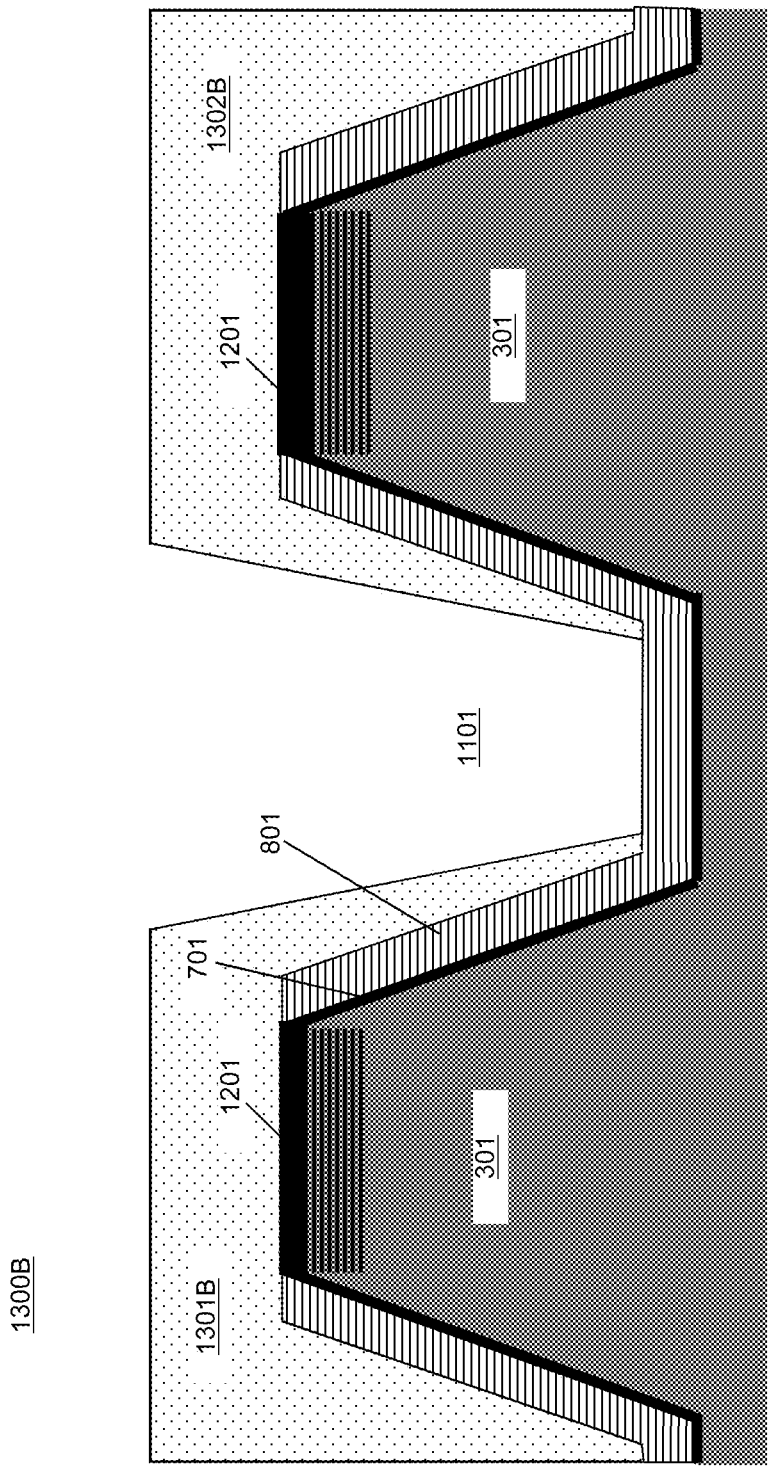

Turning again to method 100 of FIG. 1, in block 104, the floating gates may be formed by deposition and patterning of a floating gate material, which may comprise polysilicon or a metal such as titanium nitride (TiN), titanium aluminum nitride (TiAlN), and tantalum nitride (TaN), or may comprise multiple layers, such as a polysilicon layer on top of one or more metal layers. The floating gates may be deposited by conformal deposition, and are formed such that a portion of the floating gates may be located on the etch stop layer in the STI recess that was formed by removal of the oxide fill from the STI regions. In various embodiments, the sides of the floating gates may be vertical, or in other embodiments the sides of the floating gates may be sloped. In embodiments in which the sides of the floating gates are sloped, the etch chemistry of the etch that is used to pattern a polysilicon floating gate may be $CH_xF_y+O_2$, and the angle of the slope may be about 10 degrees. In other embodiments, the etch chemistry used to pattern a polysilicon floating gate may be HBr+O or HCl+O. Floating gates with sloped sides may help to prevent formation of voids during deposition of the control gate (discussed below with respect to block 106 and FIG. 15). Additionally, in some embodiments, the sides of the floating gate regions may be implanted with dopants after deposition. The implantation may comprise tilted implantation in some embodiments. FIGS. 13A-B show the device 1200 of FIG. 12 after formation of floating gates 1301A, 1302A, 1301B, and 1302B. Floating gates 1301A and 1302A as shown in FIG. 13A have vertical sides extending into recess 1101, and floating gates 1301B and 1302*b* as shown in FIG. 13B has sloped sides extending into recess 1101. The depth and shape of the floating gates 1301A, 1302A, 1301B, and 1302B may be dependent on the etch chemistry used to pattern the floating gate material after it is deposited; a floating gate such as floating gates 1301A, 1302A, 1301B, and 1302B may have any appropriate depth and shape in various embodiments. Additionally, while FIGS. 14-15, which illustrate further processing steps of method 100 of FIG. 1, are shown with respect to an example device 1300A including floating gates 1301A and 1302A with vertical sides, the same processing steps may be applied to the device 1300B including floating gates 1301B and 1302B with sloped sides to form a memory device in various embodiments. A NVM that includes floating gates such as floating gates 1301A-B having sloped sides may help to prevent void formation during deposition of the control gate. Each of floating gates 1301A, 1302A, 1301B, and 1302B comprise a portion that is located in the STI recess 1101 on the etch stop layer 801, which separates the floating gates 1301A, 1302A, 1301B, and 1302B from the substrate 301, lowering the capacitance between the floating gates 1301A, 1302A, 1301B, and 1302B and the substrate 301.

Figure 14:
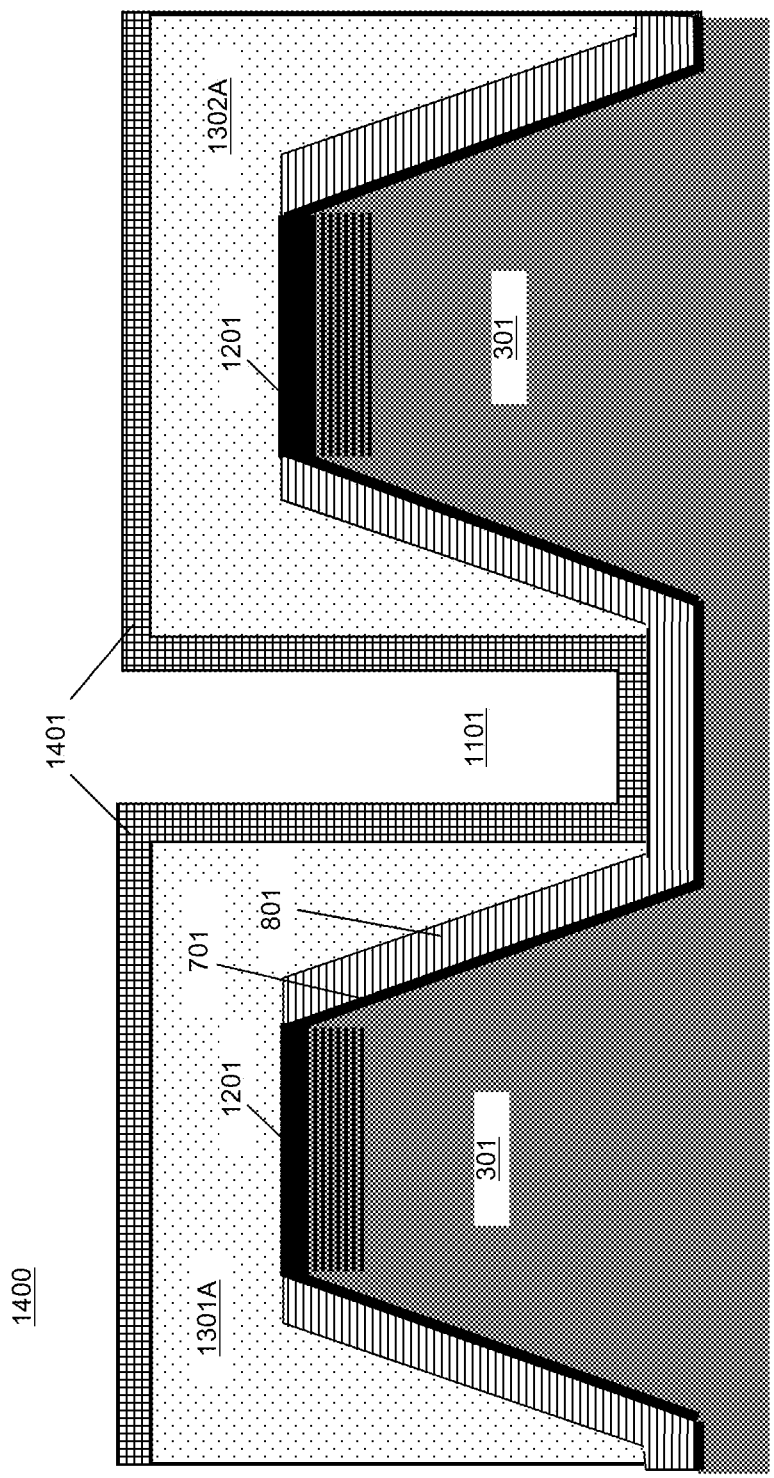
FIG. 14 is cross sectional view illustrating an embodiment of a device after formation of a gate dielectric layer.

Returning to method 100 of FIG. 1, in block 105, a gate dielectric layer may be deposited over the device, covering the floating gates and the etch stop layer located at the bottom of the recess. The gate dielectric layer may be formed by conformal deposition, and may include one or more layers of oxide and/or nitride. The gate dielectric layer may comprise a high k dielectric such as $HfO_2$, $HfSiO_2$, HfSiON, $SiO_xN_y$ or $Al_2O_3$ in some embodiments. Additionally, in some embodiments, the gate dielectric layer may include an oxide-nitride-oxide (ONO) dielectric layer. FIG. 14 shows the device 1300A of FIG. 13A after formation of the gate dielectric layer 1401 over the floating gates 1301A and 1302A and the portion of the etch stop layer 801 that is located at the bottom of recess 1101.

Figure 15:
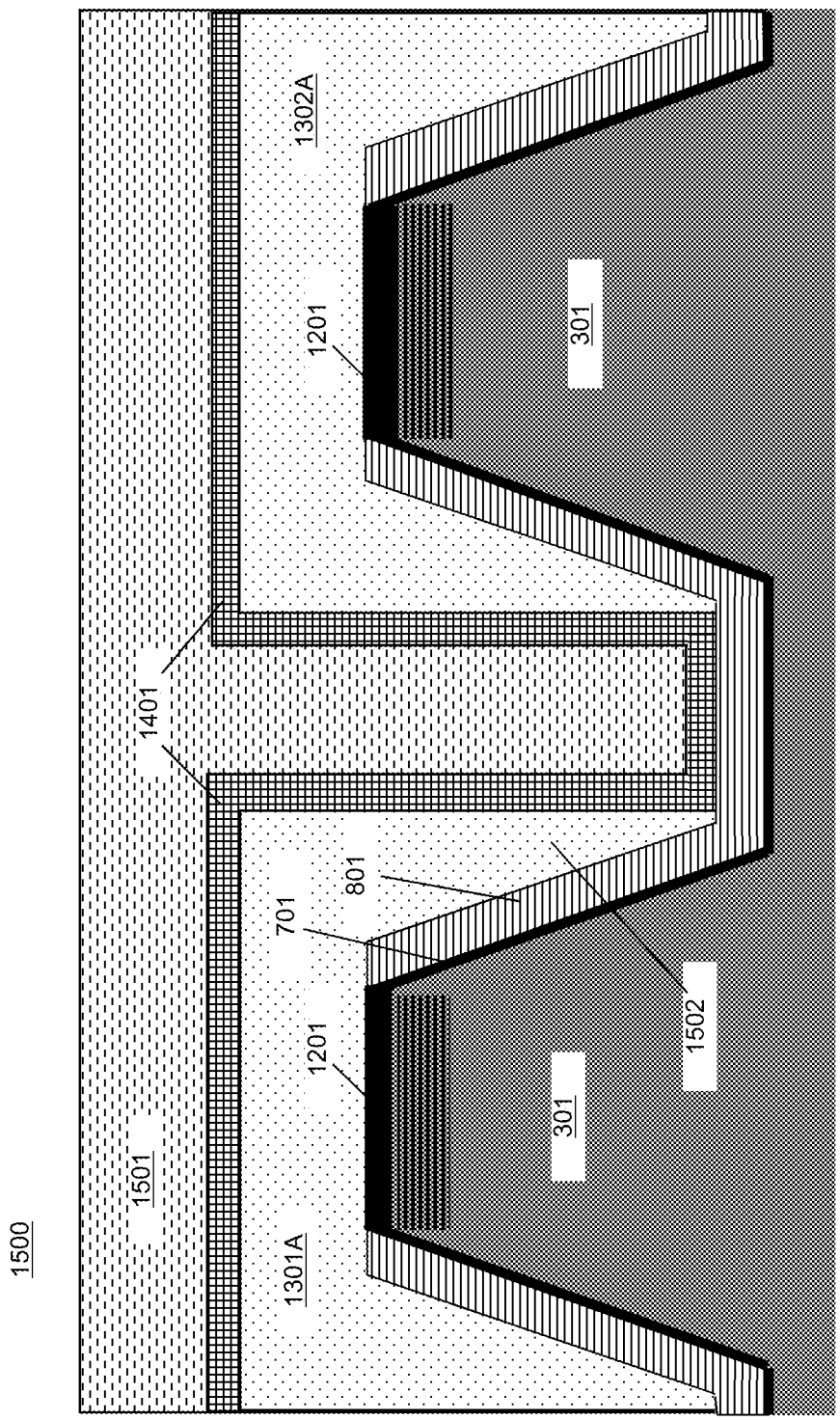
FIG. 15 is a cross sectional view illustrating an embodiment of a device after formation of a control gate.

Lastly, the flow of method 100 of FIG. 1 proceeds to block 106, in which the control gate may be formed over the gate dielectric layer. The control gate may comprise polysilicon or a metal such as TiN, TiAlN, or TaN, and may be deposited using any appropriate method of deposition. The control gate may be separated from the floating gates by the gate dielectric layer. Both the floating gates and the control gate extend into the recess in the STI region that is defined by the etch stop layer, and the floating gate may be separated from the substrate by the etch stop layer, thereby improving the gate coupling factor of the NVM device. FIG. 15 shows the device 1400 after formation of a control gate 1501 to form a NVM device 1500. As shown in FIG. 15, both the control gate 1501 and the floating gates 1301A and 1302A extend into the recess defined by etch stop layer 801. The etch stop layer 801 also separates the substrate 301 and the floating gates (for example, portion 1502 of floating gate 1301A).

Figure 2B:
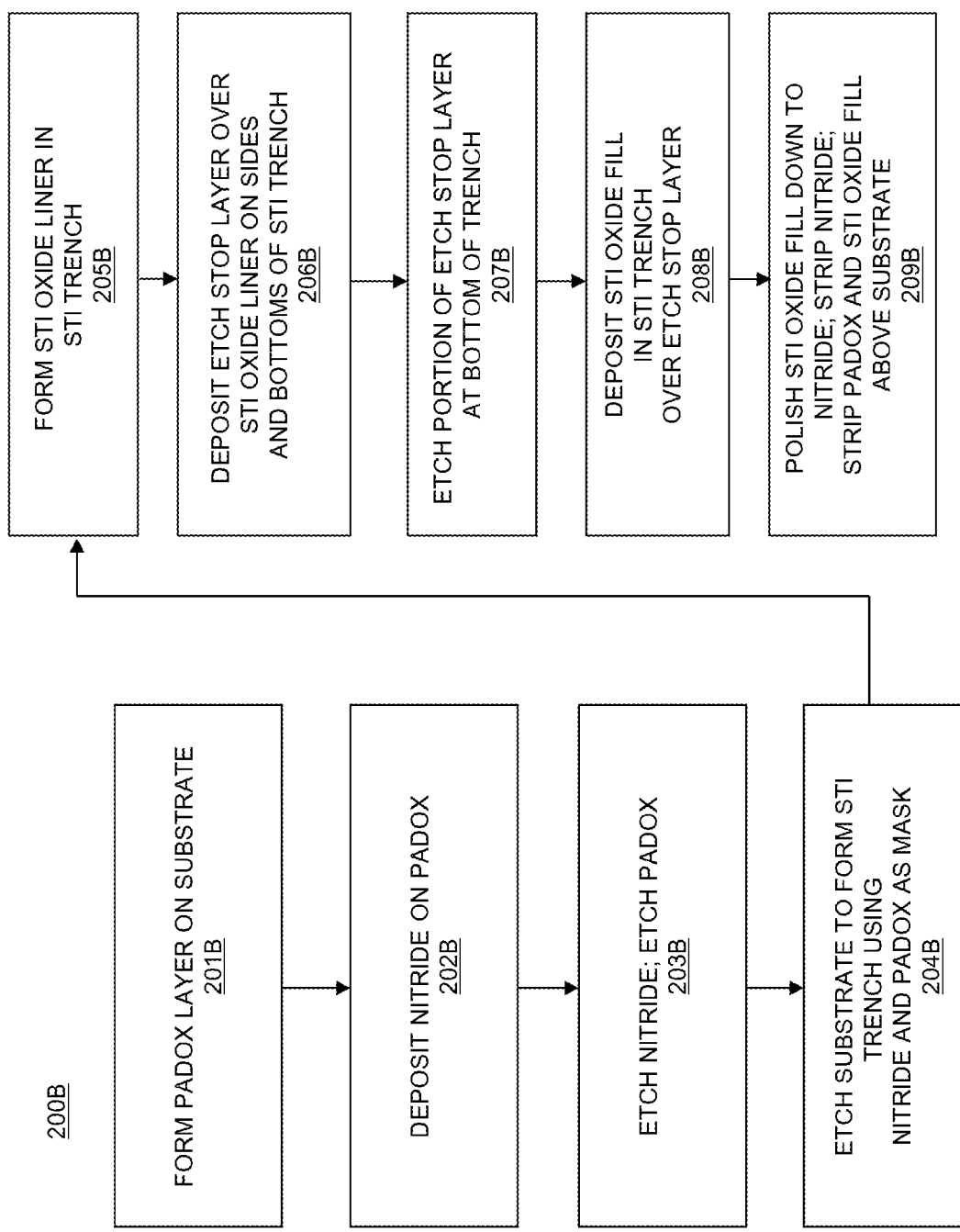

The second embodiment of the process flow of method 100 of FIG. 1, in which the etch stop layer may be located only on the sides of the STI trench, is now discussed with respect to FIG. 2B, FIGS. 3-8, and 16-23. First, in block 101 of FIG. 1, STI regions comprising an etch stop layer may be formed in a wafer comprising a silicon substrate. A flowchart of a method 200B of formation of the STI regions according to the second embodiment is shown in FIG. 2B. Referring to FIG. 2B, in block 201B, first, a padox layer, which comprises uniform, relatively thin layer of oxide, may be formed on a top surface of a silicon substrate. FIG. 3 shows an embodiment of a device 300 including a silicon substrate 301 after formation of a padox layer 302 on the top surface of the silicon substrate. Then, returning to FIG. 2B, flow proceeds to block 202B, in which a nitride layer may be formed over the padox layer. FIG. 4 shows the device 300 of FIG. 3 after formation of a nitride 401 over the padox layer 302.

Next, returning to method 200B of FIG. 2B, in block 203B the nitride and the padox may be etched to form a mask for etching of an STI trench. The padox acts as an etch stop for the nitride during patterning of the nitride; the padox may then be subsequently patterned. FIG. 5 shows the device 400 of FIG. 4 after etching the nitride 401 and the padox layer 302. Then, proceeding to block 204B of method 200B of FIG. 2B, the STI trench may be etched in the silicon substrate. FIG. 6 shows the device 500 of FIG. 5 after etching of an STI trench 601 in the silicon substrate 301.

After etching of the STI trench, flow of method 200B of FIG. 2B proceeds to block 205B, in which an STI liner may be formed in the STI trenches. The STI liner may comprise oxide, and may be formed by any appropriate method. FIG. 7 shows the device 600 of FIG. 6 after formation of an STI liner 701 on the bottom and sides of the STI trench 601.

Figure 16:
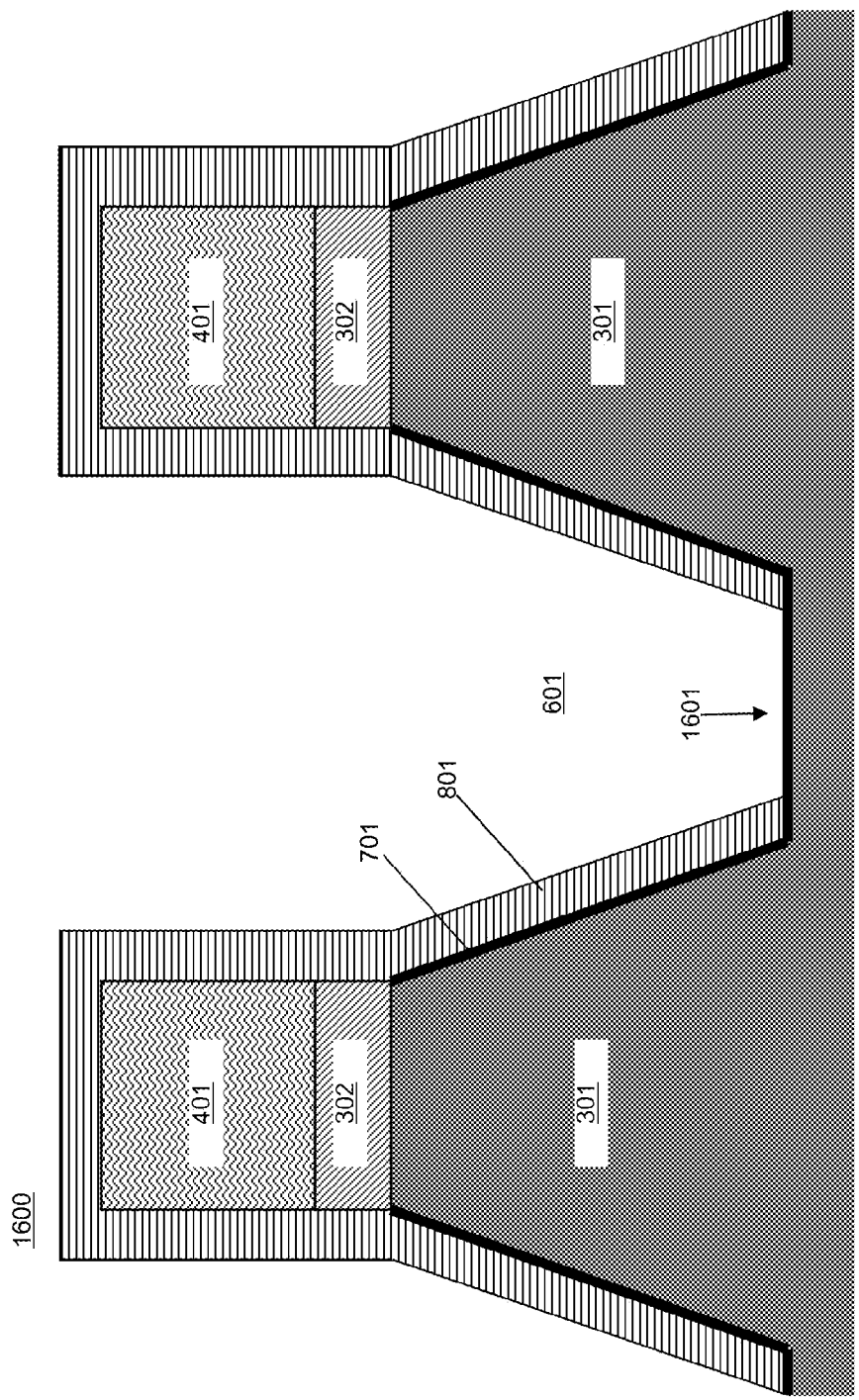
FIG. 16 is a cross sectional view illustrating an embodiment of a device after etching a portion of the etch stop layer located at the bottom of the STI trench.

Flow of method 200B of FIG. 2B then proceeds to block 206B, in which the etch stop layer may be deposited over the STI liner in the STI trench. The etch stop layer may comprise nitride. FIG. 8 shows an embodiment of the device 700 of FIG. 6 after deposition of the etch stop layer 801 over the STI liner 701. The etch stop layer covers the bottom and sides of the STI trench 601. The thickness of the etch stop layer determines the distance between the floating gate (discussed below with respect to block 104) and the substrate; therefore the deposition of the etch stop layer may be controlled to produce an etch stop layer having a desired thickness to improve the operation of the finished NVM device. Then, in block 207B of method 200B of FIG. 2B, a portion of the etch stop layer located at the bottom of the STI trench may be removed. Removal of the portion of the etch stop layer located at the bottom of the STI trench may be performed using an anisotropic nitride etch or a $CH_xF_y+O_2$ etch. FIG. 16 shows the device 800 of FIG. 8 after removal of the portion of the etch stop layer 801 located at the bottom of the STI trench 601, exposing the bottom 1601 of the STI trench 601.

Figure 17:
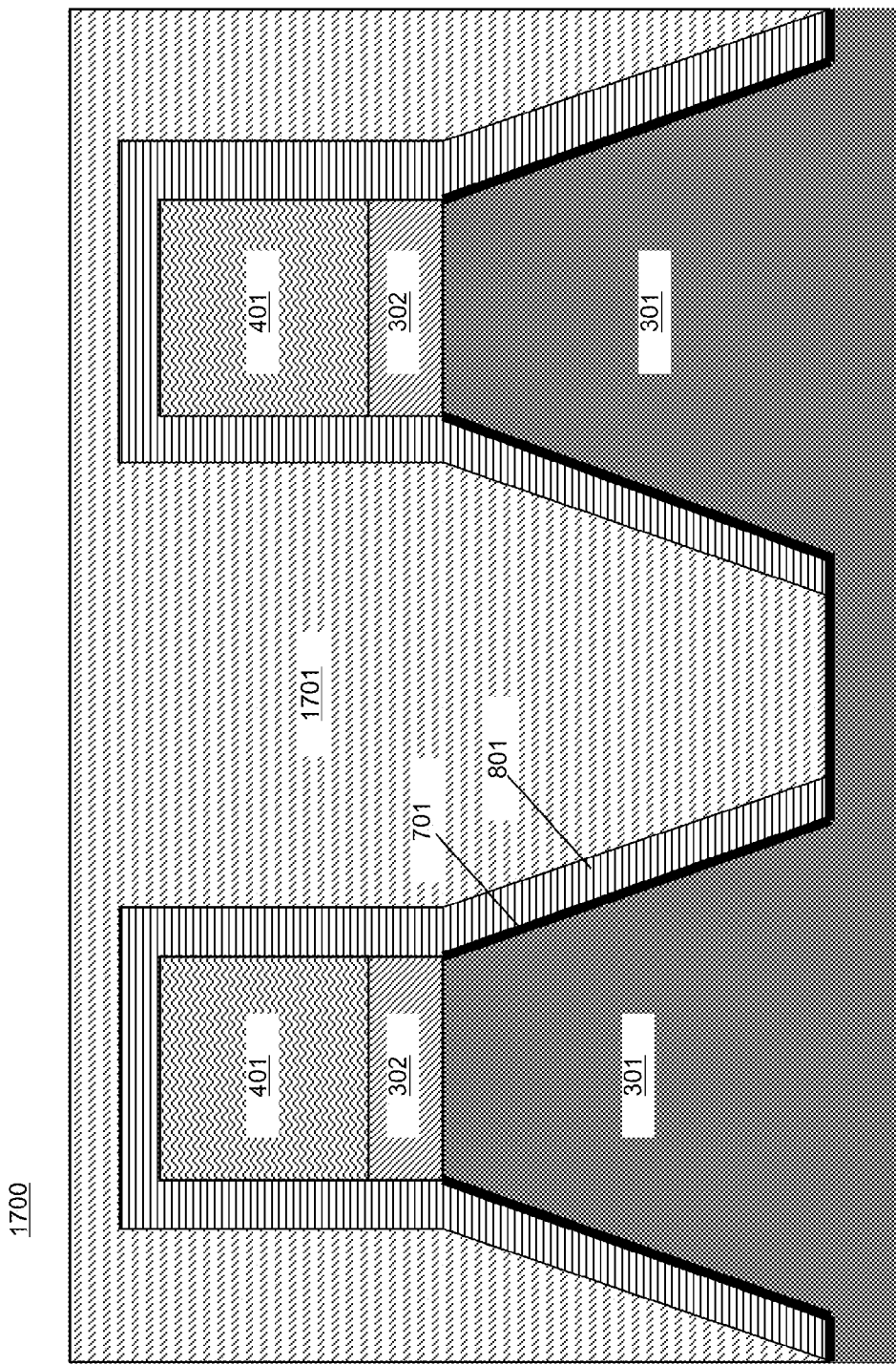
FIG. 17 is a cross sectional view illustrating an embodiment of a device after formation of a STI oxide fill.
Figure 18:
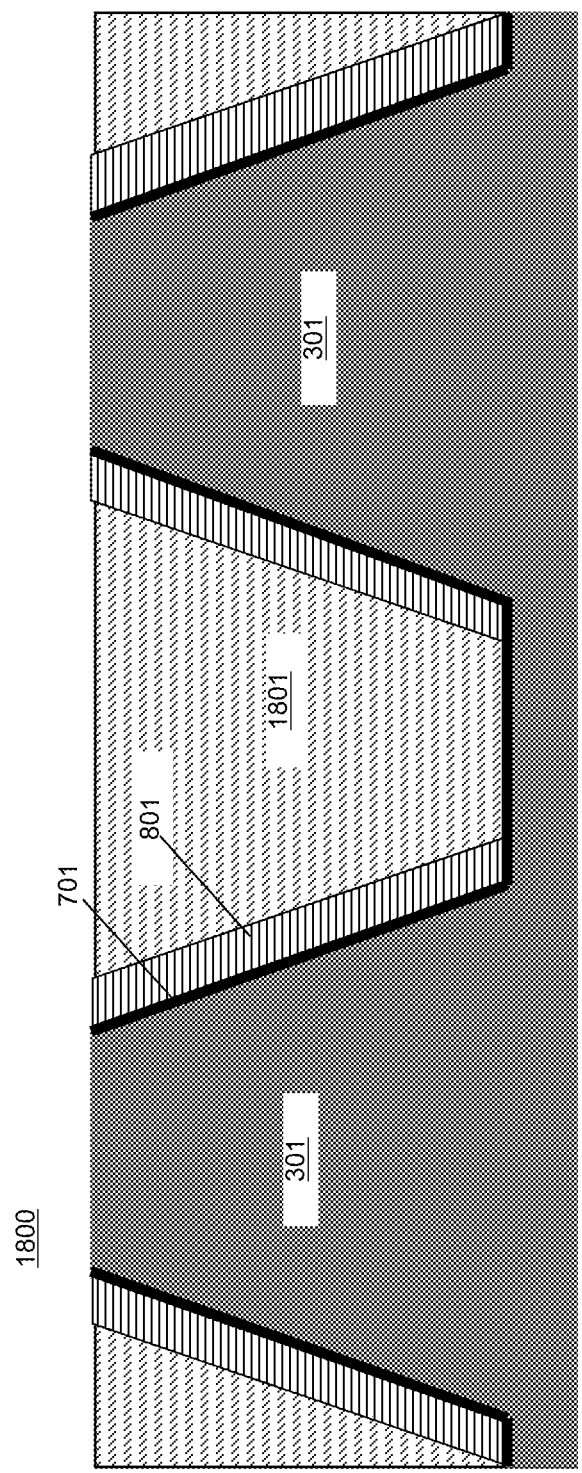
FIG. 18 is a cross sectional view illustrating an embodiment of a device after chemical mechanical polishing of the oxide fill and removal of the patterned padox and nitride.

Method 200B of FIG. 2B then proceeds to block 208B, in which an STI oxide fill may be deposited over the device, filling STI trench over the etch stop layer. FIG. 17 shows the device 1600 of FIG. 16 after deposition of the oxide fill 1701 over the device 1600; the oxide fill 1701 fills the STI trench 601 and covers the etch stop layer 801. Lastly, in block 209B of FIG. 2B, the top of the STI oxide fill may be polished down to expose the top surface of the etch stop layer, the excess etch stop and nitride on top of the substrate may be removed by etching, the padox may be removed by etching so as to expose the top surface of the silicon substrate, and the top of oxide fill may be further removed to the level of the top surface of the silicon substrate. The excess oxide fill may be removed by chemical mechanical polishing (CMP) in some embodiments. FIG. 18 shows the device 1700 of FIG. 17 after removal of the excess portion of oxide fill 1701, the excess portion of the etch stop layer 801, nitride 401, and padox layer 302 to expose the top surface of silicon substrate 301. Device 1800 of FIG. 18 comprises a silicon substrate 301 with STI regions including STI liner 701, etch stop layer 801 over the STI liner 701, and STI oxide fill 1801.

Figure 19:
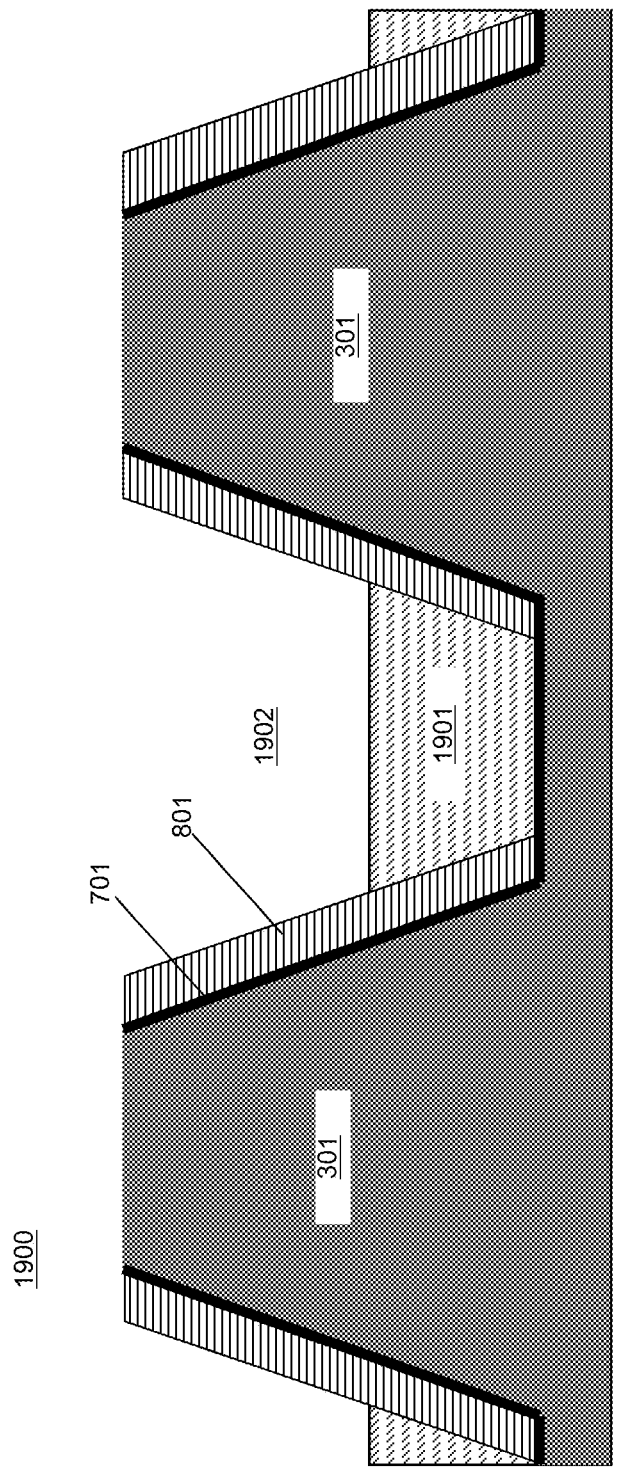
FIG. 19 is a cross sectional view illustrating an embodiment of a device after etching a portion of the STI oxide fill to the etch stop layer.

Returning to method 100 of FIG. 1, after formation of STI regions including an etch stop layer on the sides of the STI trench according to the method 200B outlined in FIG. 2B in block 101 of FIG. 1, flow proceeds to block 102, in which the oxide fill in the STI regions may be etched to form a recess. In the second embodiment of the process flow of FIG. 1, the oxide fill may be partially etched, such that the etch stop layer controls the location of the sides of the recess, while a portion of the oxide fill remains at the bottom of the STI trench. The etch of the oxide fill may comprise a hydrofluoric (HF) etch in some embodiments. FIG. 19 shows the device 1800 of FIG. 18 after etching the oxide fill 1801 to etch stop layer 801 on the sides of the STI trench to form recess 1902, leaving oxide fill 1901 at the bottom of the STI trench.

Figure 20:
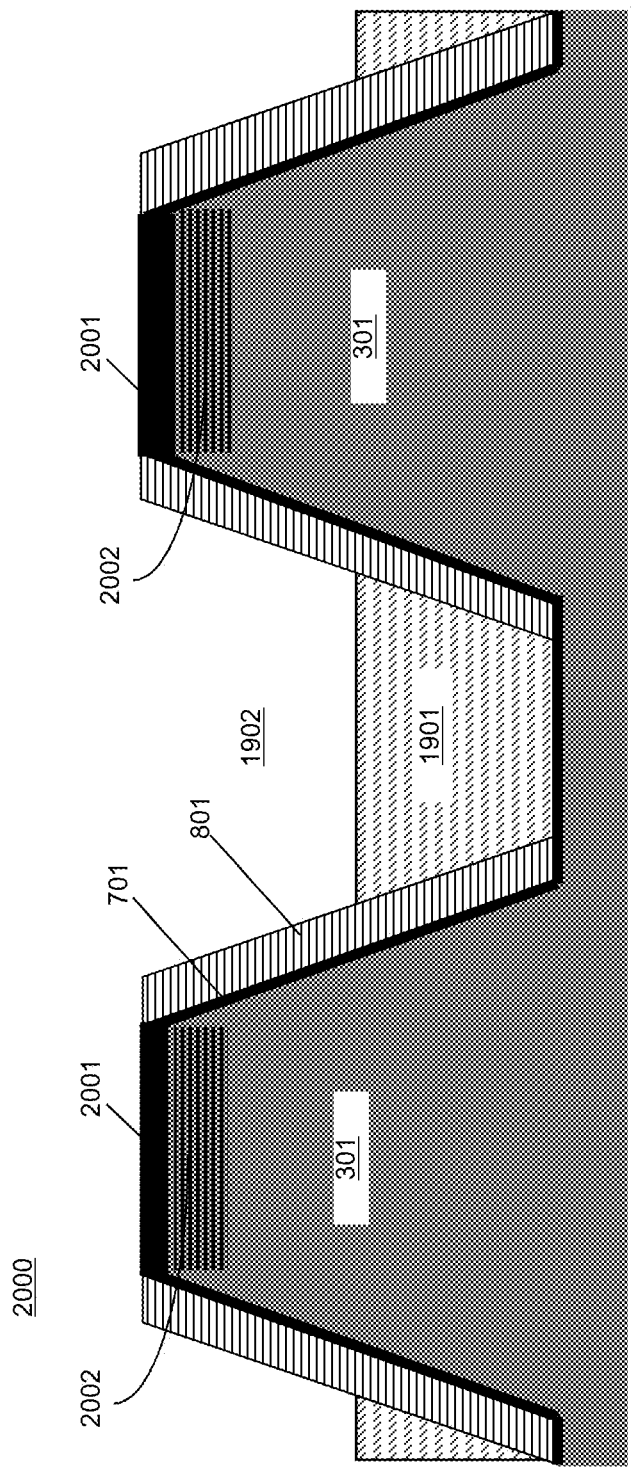
FIG. 20 is a cross sectional view illustrating an embodiment of a device after well implantation and tunnel oxide growth.

Flow of method 100 of FIG. 1 then proceeds to block 103, in which well implantation and tunnel oxide growth are performed. The well implantation forms active regions in the silicon substrate near the top surface of the substrate. In some embodiments, the well implantation may be performed before etching of the STI oxide fill is performed in block 102 of FIG. 1. After well implantation, tunnel oxide may be grown over the implanted well regions of the substrate. The well region implantation and the tunnel oxide growth may be performed by any appropriate method. For example, the tunnel oxide may be grown by chemical vapor deposition (CVD) or in-situ steam generation (ISSG) in various embodiments. The tunnel oxide may comprise a high k dielectric such as $HfO_2$, $HfSiO_2$, $HfSiON$, $SiO_xN_y$, or $Al_2O_3$ in some embodiments. In some embodiments, the order of blocks 102 and 103 in method 100 of FIG. 1 may be reversed, and the etch of the oxide fill that is performed in block 102 may be performed after the well implantation and tunnel oxide growth of block 103. FIG. 20 shows the device 1900 of FIG. 19 after implantation of well regions 2002 in the silicon substrate 301, and after growth of tunnel oxide 2001 over the well regions 2002.

Figure 21A:
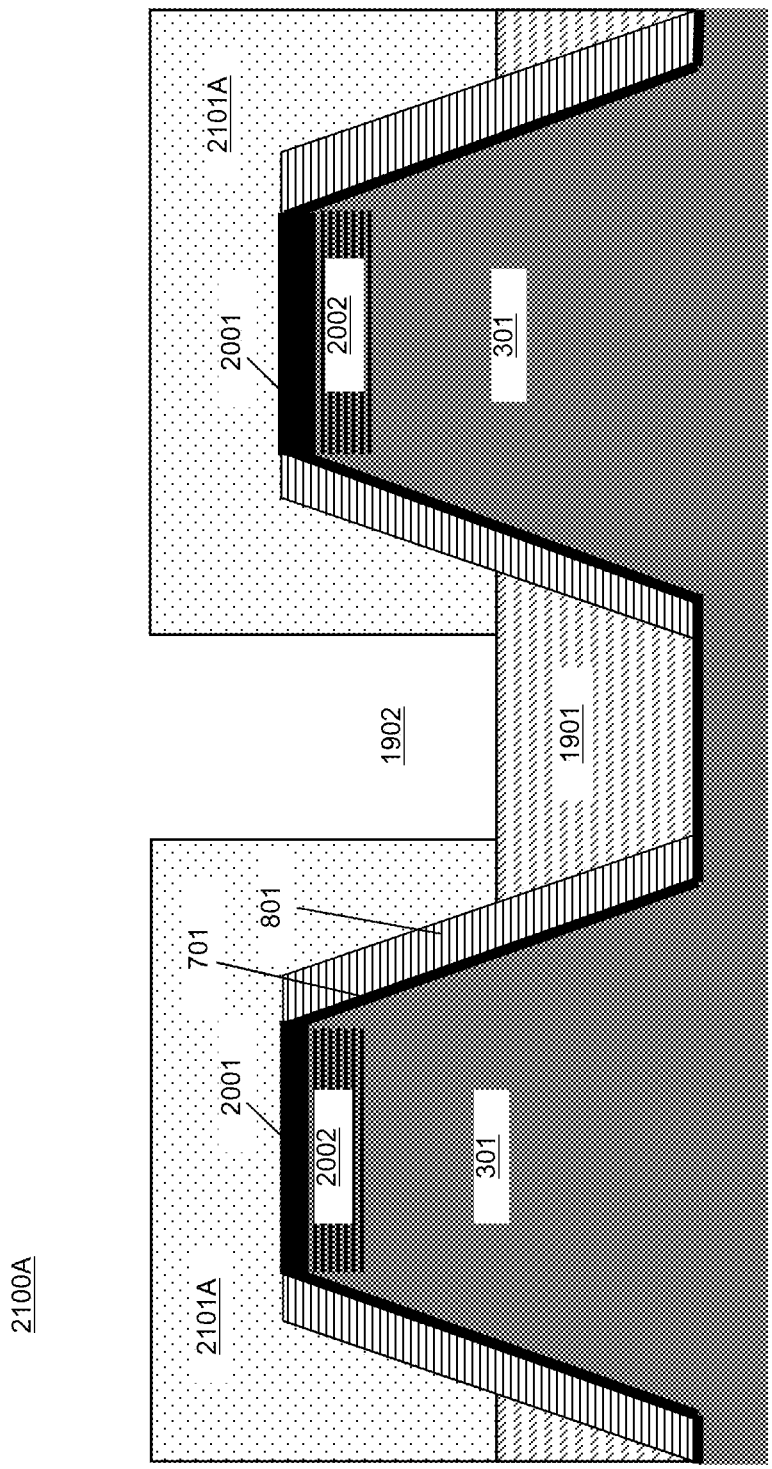
FIGS. 21A-B are cross sectional views illustrating embodiments of a device after formation of floating gates.
Figure 21B:
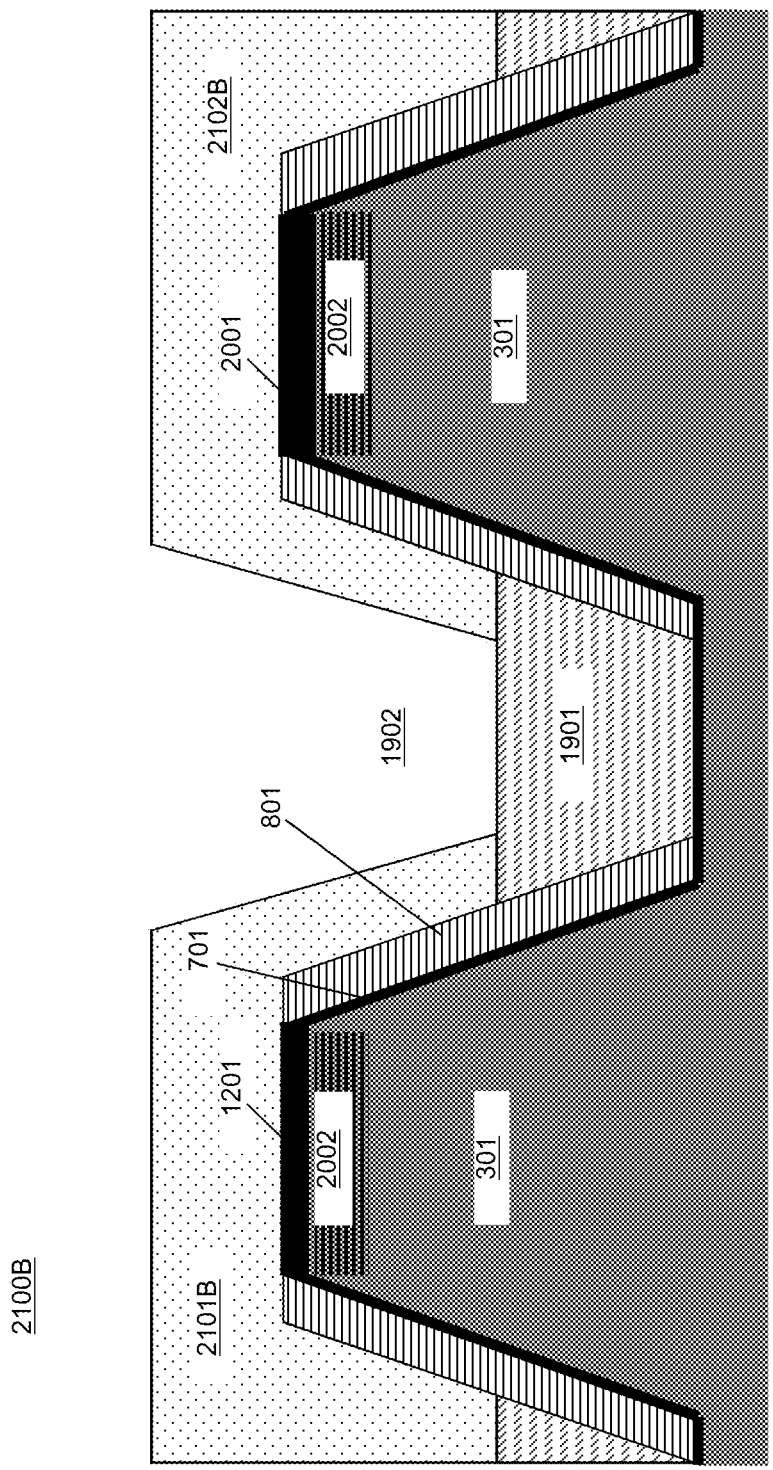

Turning again to method 100 of FIG. 1, in block 104, the floating gates are formed by deposition and patterning of a floating gate material, which may be polysilicon or a metal such as TiN, TiAlN, or TaN. The floating gates may be deposited by conformal deposition, and formed such that a portion of the floating gate located on the etch stop layer in the STI recess that was formed by removal of the oxide fill from the STI regions. In various embodiments, the sides of the floating gates may be vertical, or in other embodiments the sides of the floating gates may be sloped. In embodiments in which the sides of the floating gates are sloped, the etch chemistry of the etch that is used to pattern a polysilicon floating gate may be $CH_xF_y+O_2$, and the angle of the slope may be about 10 degrees. In other embodiments, the etch chemistry used to pattern a polysilicon floating gate may be HBr+O or HCl+O. Floating gates with sloped sides may help to prevent formation of voids during deposition of the control gate (discussed below with respect to block 106 and FIG. 23). Additionally, in some embodiments, the sides of the floating gate regions may be implanted with dopants after deposition. The implantation may comprise tilted implantation in some embodiments. FIGS. 21A-B show the device 2000 of FIG. 20 after formation of floating gates 2101A, 2102A, 2101B, and 2102B. Floating gates 2101A and 2102A as shown in FIG. 21A have vertical sides extending into recess 1902, and floating gates 2101B and 2102b as shown in FIG. 21B has sloped sides extending into recess 1902. The depth and shape of the floating gates 2101A, 2102A, 2101B, and 2102B may be dependent on the etch chemistry used to pattern the floating gate material after it is deposited; a floating gate such as floating gates 2101A, 2102A, 2101B, and 2102B may have any appropriate depth and shape in various embodiments. Additionally, while FIGS. 22-23, which illustrate further processing steps of method 100 of FIG. 1, are shown with respect to an example device 2100A including floating gates 2101A and 2102A with vertical sides, the same processing steps may be applied to the device 2100B including floating gates 2101B and 2102B with sloped sides to form a memory device in various embodiments. A NVM that includes floating gates such as floating gates 2101A-B having sloped sides may help to prevent void formation during deposition of the control gate. Each of floating gates 2101A, 2102A, 2101B, and 2102B comprise a portion that may be located in the STI recess 1902 on the etch stop layer 801, which separates the floating gates 2101A, 2102A, 2101B, and 2102B from the substrate 301, lowering the capacitance between the floating gates 2101A, 2102A, 2101B, and 2102B and the substrate 301.

Figure 22:
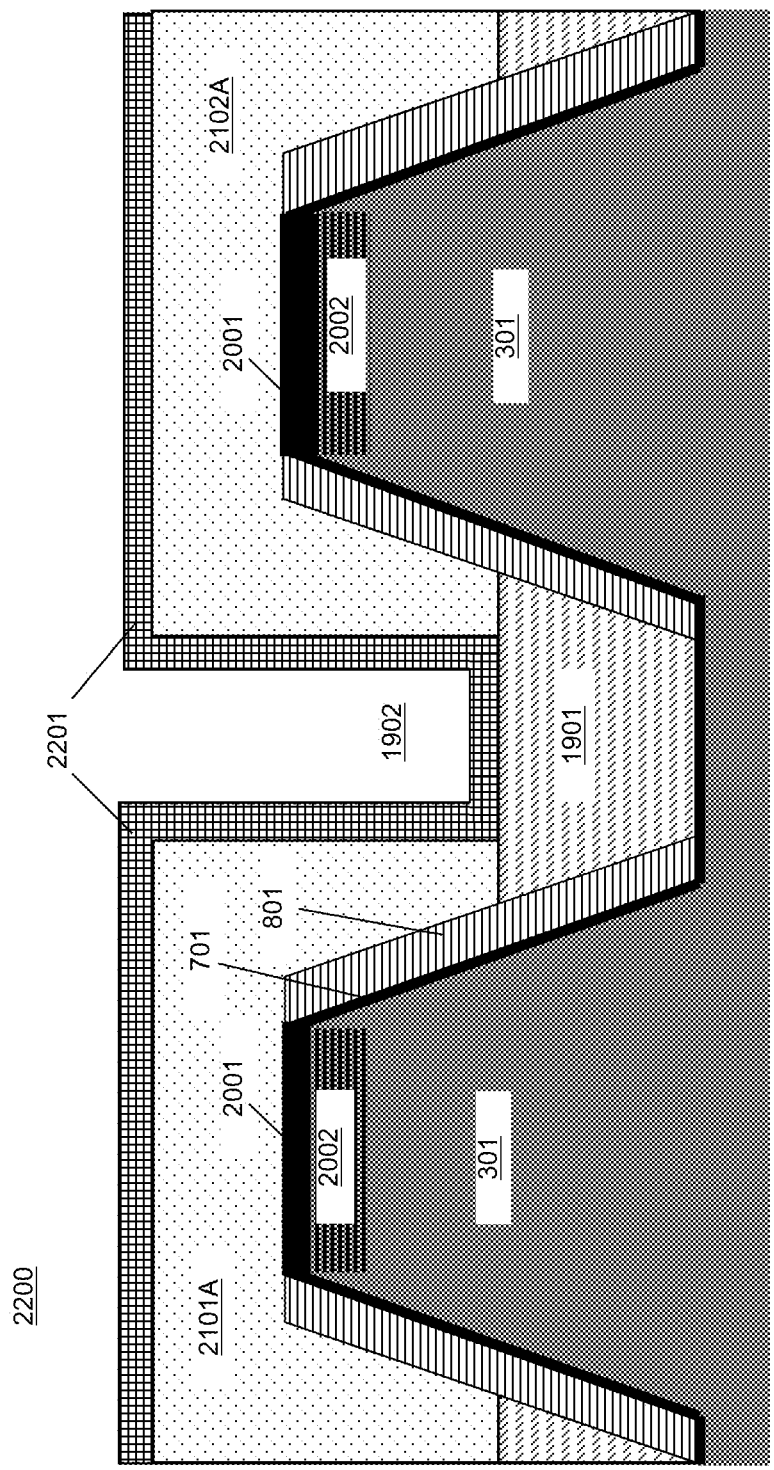
FIG. 22 is a schematic block diagram of a cross sectional view illustrating an embodiment of a device after formation of a gate dielectric layer.

Returning to method 100 of FIG. 1, in block 105, a gate dielectric layer may be deposited over the device, covering the floating gates and the etch stop layer located at the bottom of the recess. The gate dielectric layer may be formed by conformal deposition, and may include one or more layers of oxide and/or nitride. The gate dielectric layer may comprise a high k dielectric such as $HfO_2$, $HfSiO_2$, HfSiON, $SiO_xN_y$, or $Al_2O_3$ in some embodiments. Additionally, in some embodiments, the gate dielectric layer may include an oxide-nitride-oxide (ONO) dielectric layer. FIG. 22 shows the device 2100A of FIG. 21A after formation of the gate dielectric layer 2201 over the floating gates 2101A and 2102A and remaining oxide fill 1901 located at the bottom of recess 1902.

Figure 23:
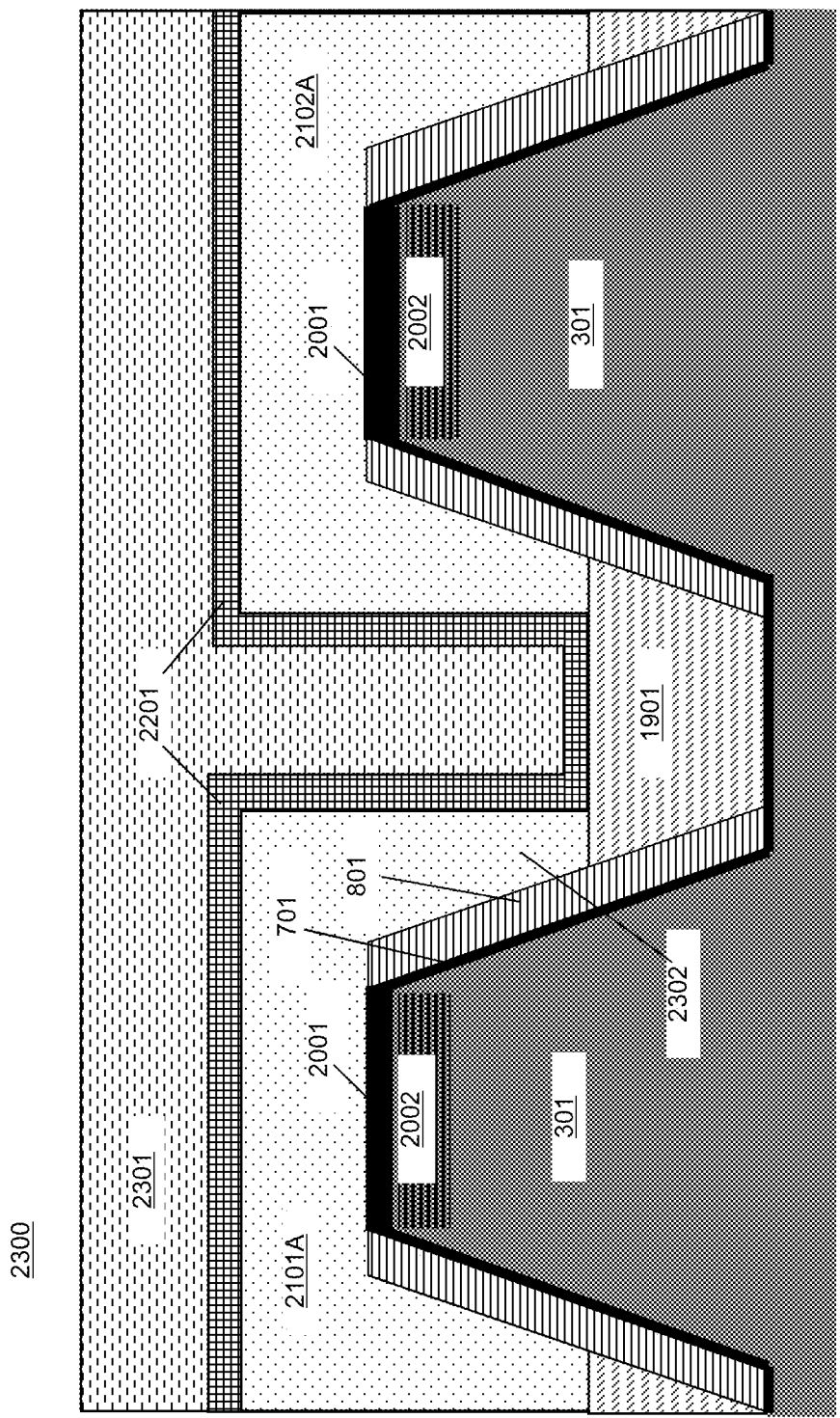
FIG. 23 is a schematic block diagram of a cross sectional view illustrating an embodiment of a device after formation of a control gate.

Lastly, the flow of method 100 of FIG. 1 proceeds to block 106, in which the control gate may be formed over the gate dielectric layer. The control gate may comprise polysilicon or a metal such as TiN, TiAlN, or TaN, and may be deposited using any appropriate method of deposition. The control gate may be separated from the floating gates by the gate dielectric layer. Both the floating gates and the control gate extend into the recess in the STI region defined by the etch stop layer and the remaining oxide fill, and the floating gate may be separated from the substrate by the etch stop layer, thereby improving the gate coupling factor of the NVM device. FIG. 23 shows the device 2200 after formation of a control gate 2301 to form a NVM device 2300. As shown in FIG. 23, both the control gate 2301 and the floating gates 2101A and 2102A extend into the recess defined by etch stop layer 801 and the remaining oxide fill 1901. The etch stop layer 801 also separates the substrate 301 and the floating gates (for example, portion 2302 of floating gate 2101A).

The technical effects and benefits of exemplary embodiments include formation of an NVM memory device having an improved gate coupling factor and therefore improved performance.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method comprising:
    forming a plurality of shallow trench isolation (STI) regions in a substrate, the plurality of STI regions comprising an etch stop layer, wherein forming each one of the plurality of STI regions comprises:
        etching a STI trench in the substrate by a first etch, the STI trench comprising a bottom and sides;
        forming a STI liner on the bottom and sides of the STI trench;
        forming the etch stop layer over the STI liner, wherein the etch stop layer is further formed over a padox layer that is located directly on a top surface of the substrate adjacent to the STI trench and a nitride layer that is located on the padox layer;
        forming an oxide fill directly on top of the etch stop layer;
        etching the oxide fill in the STI region by a second etch to expose a portion of the etch stop layer in the bottom of the STI trench and to form a recess in the STI region, wherein the second etch further removes the padox layer, the nitride layer, and a portion of the etch stop layer that was located over the padox layer and the nitride layer, such that the top surface of the substrate is exposed adjacent to the STI region after the second etch, wherein the recess in each one of the plurality of STI regions is defined by a bottom and sides comprising the etch stop layer, and wherein the second etch further removes the oxide fill from the recess; and
    after forming the recess in the STI region:
        implanting a well region in the exposed top surface of the substrate adjacent to the recess;
        growing a tunnel oxide over the implanted well region, wherein the tunnel oxide does not extend into the recess; and
        forming a floating gate over the implanted well region and the tunnel oxide, the floating gate comprising a portion that extends laterally into the recess in the STI region and vertically to the etch stop layer comprising the bottom of the recess in the STI region, wherein the etch stop layer separates the portion of the floating gate that extends into the recess in the STI region from the substrate;
        wherein the etch stop layer in the recess in each one of the plurality of STI regions separates multiple floating gates from the substrate.

2. The method of claim 1, wherein the etch stop layer comprises nitride.

3. The method of claim 1, wherein the floating gate comprises a floating gate material comprising one of polysilicon, titanium nitride (TiN), titanium aluminum nitride (TiAlN), and tantalum nitride (TaN), and wherein forming the floating gate comprises conformal deposition of the floating gate material and etching of the deposited floating gate material by a third etch.

4. The method of claim 3, wherein the floating gate comprises sloped sides having an angle of about 10 degrees, and wherein the third etch comprises $CH_xF_y+O_2$.

* * * * *